(12) United States Patent
Yamazaki et al.

(10) Patent No.: US 8,525,323 B2
(45) Date of Patent: Sep. 3, 2013

(54) ENCAPSULATING PACKAGE, PRINTED CIRCUIT BOARD, ELECTRONIC DEVICE AND METHOD FOR MANUFACTURING ENCAPSULATING PACKAGE

(75) Inventors: Takao Yamazaki, Tokyo (JP); Masahiko Sano, Tokyo (JP); Seiji Kurashina, Tokyo (JP); Yoshimichi Sogawa, Tokyo (JP)

(73) Assignee: NEC Corporation, Tokyo (JP)

( * ) Notice: Subject to any disclaimer, the term of this patent is extended or adjusted under 35 U.S.C. 154(b) by 199 days.

(21) Appl. No.: 13/054,251

(22) PCT Filed: Jan. 28, 2009

(86) PCT No.: PCT/JP2009/051325
§ 371 (c)(1),
(2), (4) Date: Jan. 14, 2011

(87) PCT Pub. No.: WO2010/010721
PCT Pub. Date: Jan. 28, 2010

(65) Prior Publication Data
US 2011/0114840 A1   May 19, 2011

(30) Foreign Application Priority Data
Jul. 25, 2008  (JP) ................................. P2008-192342

(51) Int. Cl.
*H01L 23/12*   (2006.01)
(52) U.S. Cl.
USPC ............................. 257/704; 257/414; 257/434
(58) Field of Classification Search
USPC ................. 257/678, 787, 701, 704, 414, 431, 257/432, 433, 434
See application file for complete search history.

(56) References Cited

U.S. PATENT DOCUMENTS

| | | | |
|---|---|---|---|
| 6,891,259 B2 * | 5/2005 | Im et al. | 257/687 |
| 7,394,659 B2 * | 7/2008 | Colgan et al. | 361/718 |
| 7,786,561 B2 * | 8/2010 | Pornin et al. | 257/682 |
| 2004/0036183 A1 * | 2/2004 | Im et al. | 257/796 |
| 2004/0262766 A1 * | 12/2004 | Houle | 257/758 |
| 2005/0189621 A1 * | 9/2005 | Cheung | 257/619 |
| 2007/0096295 A1 * | 5/2007 | Burtzlaff et al. | 257/704 |
| 2008/0296757 A1 * | 12/2008 | Hoffman et al. | 257/713 |

FOREIGN PATENT DOCUMENTS

| | | |
|---|---|---|
| JP | 4-326554 A | 11/1992 |
| JP | 10-132654 A | 5/1998 |
| JP | 11-176969 A | 7/1999 |
| JP | 11-326037 A | 11/1999 |
| JP | 2000200847 A | 7/2000 |
| JP | 2003086722 A | 3/2003 |

(Continued)

OTHER PUBLICATIONS

International Search Report for PCT/JP2009/051325 mailed Mar. 17, 2009.

*Primary Examiner* — S. V. Clark

(57) ABSTRACT

The present invention is: a package main body section having a hollow section; and an electronic device provided in the hollow section in the package main body section, in the package main body section, there being formed a through hole, through which the hollow section communicates with outside of the package main body section, and in the through hole, there being provided a sealing section in which a vicinity of the through hole is partly heated and a constituent material of the package main body section is melted to thereby block the through hole.

21 Claims, 28 Drawing Sheets

(56) References Cited

FOREIGN PATENT DOCUMENTS

| JP | 2003139616 A | 5/2003 |
|---|---|---|
| JP | 2004320150 A | 11/2004 |
| JP | 2005223295 A | 8/2005 |
| JP | 2006010405 A | 1/2006 |
| JP | 2007227456 A | 9/2007 |
| JP | 2008016693 A | 1/2008 |

* cited by examiner

ENCAPSULATING PACKAGE, PRINTED CIRCUIT BOARD, ELECTRONIC DEVICE AND METHOD FOR MANUFACTURING ENCAPSULATING PACKAGE

This application is the National Phase of PCT/JP2009/051325, filed Jan. 28, 2009, which is based upon and claims the benefit of priority from Japanese Patent Application No. 2008-192342, filed on Jul. 25, 2008, the content of which is incorporated herein in its entirety by reference.

TECHNICAL FIELD

The present invention relates to an encapsulating package having an electronic device encapsulated therein, and a manufacturing method thereof.

BACKGROUND ART

In recent years, for a package or a device having an electronic device such as an infrared ray sensor, gyro sensor (angular velocity sensor), temperature sensor, pressure sensor, and acceleration sensor vacuum-encapsulated therein, there has been a demand for miniaturization, technological advances in performance, and cost reductions. In particular, for a package or a device having an infrared ray sensor, which is used in a surveillance camera for night-time security or is used in thermography for calculating and displaying temperature distribution, mounted therein, the inside thereof needs to be vacuum-encapsulated.

In general, as an infrared ray detecting devices, a quantum type and a thermal type exist. Among these, although the thermal type has a lower level of tracking capability compared to that of the quantum type, since it is of a form which detects a relative thermal quantity, it may be made in a non-cooling form and the structure thereof may be simplified. As a result, manufacturing cost can be kept low with the thermal type.

In a package or device having this thermal type infrared ray sensor mounted therein, an infrared ray which has been transmitted through a window is absorbed by a light-receiving section of the detecting device, and the temperature of the vicinity of the light-receiving section changes. Further, resistance change associated with this temperature change is detected as a signal.

Here, in order to detect a signal with a high level of sensitivity, the light-receiving section needs to be thermally insulated. Therefore, this thermal insulation property has been conventionally ensured by having a structure in which the light-receiving section is floated in an empty space, or by arranging the detecting element inside a vacuum container.

As such a thermal type non-cooling infrared ray sensor device, for example, there is a structure disclosed in Japanese Unexamined Patent Application, First Publication No. H11-326037 (refer to Patent Document 1).

FIG. 42 shows a cross-sectional structure of this non-cooling infrared ray sensor device.

This device includes a substrate 101 having a light-receiving section 102, and an infrared transmitting window 104 having one or more through holes 105, which is arranged at a distance from the light-receiving section 102 while a space 103 is present therebetween. Furthermore, the substrate 101 and the transmitting window 104 are air-tightly fixed on a bond surface which completely surrounds the light-receiving section 102. In this package, there is provided a structure in which the space 103 between the substrate 101 and the transmitting window 104 is made a vacuum by evacuating the air therein through the through holes 105, and then the through holes 105 are sealed by a sealing material 106 such as solder.

Moreover, a similar thermal type non-cooling infrared ray sensor device, there is a structure disclosed in Japanese Unexamined Patent Application, First Publication No. H10-132654 (refer to Patent Document 2).

FIG. 43 shows a cross-sectional structure of this non-cooling infrared ray sensor device.

This device includes: a base 112 having an infrared ray detecting element 111; a lid 115 which has an infrared ray incident hole 116, through which an infrared ray is incident, and which is joined with the base 112; an infrared optical component 117 which is fixed on the lid 115 by a fixing material 118 so as to block the infrared ray incident hole 116; a vacuum sealing hole 119 provided so as to pass through the lid 115; and a sealing material 120 which has a melting temperature lower than a melting temperature of the fixing material 118, and which blocks the vacuum sealing hole 119.

Furthermore, in general, there occurs a phenomenon such that once an electronic device has been encapsulated in a vacuum atmosphere, gas molecules ($H_2O$, $O_2$, $N_2$, and so forth) having been adsorbed on the surface inside a vacuum encapsulating package are slowly released into the space inside the package as time advances, and the level of vacuum within the package is reduced. As a result, there is a problem in that the performance of the electronic device is reduced (in an infrared ray sensor for example, the sensitivity of output signals is reduced).

Consequently, in a conventional vacuum encapsulating package, in order to remedy this type of problem, a material called a "getter" is mounted inside the package, so that even in a case where outgassing occurs inside the package described above, this getter absorbs the gas molecules, thereby preventing the level of vacuum from being reduced.

As a material of the getter, for example, zirconium, vanadium, iron, or an alloy of these materials is used. However, if it is left in the atmosphere, gas molecules become adsorbed on the surface thereof, and consequently it becomes saturated and unable to adsorb gas no more. Therefore, before mounting it inside the vacuum encapsulating package and vacuum encapsulating it, it is necessary to perform a so-called "activation" process, in which heat (approximately 400° C. to 900° C.) is applied to the getter to thereby release molecules on the surface, and having completed the activation process, the getter needs to be encapsulated in the vacuum atmosphere.

As such a thermal type non-cooling infrared ray sensor device having a getter mounted therein and a manufacturing method thereof, for example, there is a technique disclosed in Japanese Unexamined Patent Application, First Publication No. 2003-139616 (refer to Patent Document 3). FIG. 44 shows a cross-sectional structure of this non-cooling infrared ray sensor device. In this structure, there is disclosed a technique in which a getter 122 is connected to terminals 113, a connecting point of which is provided each inside and outside the package, and by flowing electric current to these terminals 113 from the terminals 113 outside the package, a heater 110 (which is electrically connected to the terminals 113: refer to FIG. 45) built into the getter 122 is heated and the getter 122 is heated and activated at the same time. Furthermore, in Patent Document 3 mentioned above, as shown as another technique in FIG. 46, there is also disclosed a method in which the getter 122 is weld-bonded on the inner surface of a metal cap 124, and the getter 122 is heated and activated by bringing a heated external heater 125 in contact with the metal cap 124.

Moreover, as a thermal type non-cooling infrared ray sensor device having the getter 122 mounted therein, and a manufacturing method thereof, in addition to these, there is a technique disclosed in Japanese Unexamined Patent Application, First Publication No. H11-326037 (Patent Document 1 mentioned above). That is to say, the method, as shown in FIG. 47, is such that a getter 122 wired through vacuuming through holes 105 provided in an infrared ray transmitting window, is arranged within a space 103 between a substrate 127 and an infrared optical component (detection target selecting material) 117, and the getter 122 is heated and activated by applying electricity to a wire 130 arranged through the through holes 105. Moreover, there is a technique disclosed in Japanese Unexamined Patent Application, First Publication No. 2006-10405 (refer to Patent Document 4). That is to say, the method, as shown in FIG. 48, is such that a getter 122 mounted on a spacer 131 connected to an infrared optical component 117 is brought in contact with a lower heater 135 and is heated and activated within a vacuum chamber 133, and then a substrate 127 on which an infrared ray detecting device 111 is formed, is bonded with the infrared optical component 117 within a vacuum atmosphere.

[Patent Document 1] Japanese Unexamined Patent Application, First Publication No. H11-326037
[Patent Document 2] Japanese Unexamined Patent Application, First Publication No. H10-132654
[Patent Document 3] Japanese Unexamined Patent Application, First Publication No. 2003-139616
[Patent Document 4] Japanese Unexamined Patent Application, First Publication No. 2006-10405

DISCLOSURE OF INVENTION

Problem to be Solved by the Invention

However, there are the following problems in the vacuum encapsulating packages shown in FIG. 42 and FIG. 43.

1) For example, to describe using FIG. 43, in the case of performing a process of sealing the vacuum sealing hole (sealing hole) 119 using the sealing material 120, the entire infrared ray detecting package or the infrared optical component (detection target selecting material) in the vicinity of the sealing material 120 will also have to be heated, and therefore the melting point of the sealing material 120 needs to be considerably lower than the melting point of the fixing material 118 which bonds the infrared optical component (detection target selecting material) 117 and the lid (container main body) 115. However, considering the points including reliability and manufacturing process, it is realistically difficult to select a fixing material 118 and a sealing material 120 having a considerable difference in the melting point therebetween (that is to say, manufacturing is difficult), and also the level of freedom allowed in the structure design is reduced.

2) Moreover, since the method is such that having performed vacuuming from the vacuum sealing hole (sealing hole) 119 in the vacuum atmosphere, the sealing material 120 is placed in the vacuum sealing hole (sealing hole) 119 and is then melted, it is difficult to handle the sealing material 120 in the vacuum atmosphere. There is a possible method in which, for example, a mechanism such as robot-handling mechanism is installed inside a vacuum apparatus. However, the cost of apparatus manufacturing becomes high as the level of quality and performance of each component thereof need to be high in order to realize a high level of vacuum, the cost of manufacturing the robot-handling mechanism itself is high in the first place, and further, the size of the entire apparatus is made large by providing a transporting mechanism. As a result, it leads to high manufacturing cost for the vacuum apparatus for manufacturing a vacuum encapsulating package.

Moreover, it may be considered that when installing a package in a state before it is vacuum-encapsulated inside the vacuum apparatus, by preliminarily placing the sealing material 120 over the vacuum sealing hole (sealing hole) 119 (at this time, the sealing material 120 is arranged so that it will not completely block the vacuum sealing hole), the type of handling hardship described above is resolved. However, even in the air and not in the vacuum atmosphere, it is difficult to place the sealing material 120 over the vacuum sealing hole (sealing hole) 119, and then install the pre-vacuum-encapsulated package inside the vacuum chamber while not moving the sealing material 120. Moreover, the level of productivity is obviously low.

Moreover, there are the following problems in the conventional vacuum encapsulating packages shown in FIG. 44, FIG. 45, FIG. 46, FIG. 47, and FIG. 48.

3) For example, there is a problem in the conventional vacuum encapsulating packages shown in FIG. 44 and FIG. 45, in which, as shown in FIG. 45, the getter 122 needs to have a built-in heater 123, and manufacturing of the getter 122 cannot be automated, consequently making the getter 122 itself expensive. As a result, the cost for manufacturing the vacuum encapsulating package using this, becomes high.

4) Moreover, there is a problem in the manufacturing method of the conventional vacuum encapsulating package shown in FIG. 46 or FIG. 48, in which there is a need for installing a special mechanism, a robot-handling mechanism, or the like capable of raising or lowering a machine component within the vacuum apparatus so that the metal cap 124 or the infrared optical component 117 can be raised or lowered in the vacuum atmosphere and can be connected to a ceramic package 126 or to the substrate 127, and consequently the vacuum apparatus itself becomes expensive. As a result, equipment investment cost for the manufacturing apparatus becomes high.

5) Furthermore, there is a problem in the manufacturing method of the conventional vacuum encapsulating package shown in FIG. 47 in which for each package, the wiring 128 connected to the getter 122 needs to pass through the through holes 105 formed in the infrared optical component 117, and therefore the level of productivity is low and it is difficult to achieve inexpensive manufacturing cost for the vacuum encapsulating package in this type of method.

Moreover, here, the vacuum encapsulating package having an infrared ray sensor mounted as an electronic device is taken as a representative example of an airtight encapsulating package, with reference to Patent Documents 1, 2, 3, and 4. However, needless to say, the above problems 1), 2), 3), 4), and 5) are still present even in those cases where the electronic device is a device other than the infrared ray sensor.

Furthermore, the above problem 1) is present even in a case where the package configuration of the electronic device is not a vacuum encapsulated package (the inside of the package is vacuum) and is an airtight encapsulating package in which the atmosphere inside the package is simply isolated from the atmosphere outside the package.

The present invention takes into consideration the above circumstances, and an object thereof is to provide an airtight encapsulating package, a vacuum encapsulating package, a printed circuit board having these mounted thereon, an electronic device, and a method for manufacturing an encapsulating package, in which a through hole can be quickly and easily blocked, no expensive vacuum apparatus (with a movable machine component provided therein, or with a robot-handling mechanism or the like provided therein) is used, superior productivity can be achieved, there is provided a function of preventing a reduction in the level of vacuum even on a long term basis, and the manufacturing cost thereof can be reduced.

Means for Solving the Problem

In order to solve the above problems, the present invention employs the following measures.

The present invention includes a package main body section having a hollow section; and an electronic device provided in the hollow section in the package main body section, in the package main body section, there being formed a through hole, through which the hollow section communicates with outside of the package main body section, and in the through hole, there being provided a sealing section in which a vicinity of the through hole is partly heated and a constituent material of the package main body section is melted to thereby block the through hole.

Moreover, the present invention includes a package main body section having a hollow section; and an electronic device provided in the hollow section in the package main body section, in the package main body section, there being formed a through hole, through which the hollow section communicates with outside of the package main body section, in a vicinity of the through hole, there being provided a low-melting point section having a melting point lower than that of the package main body section, and in the through hole, there being provided a sealing section in which the low-melting point section in the vicinity of the through hole is partly heated and the low-melting point section is melted to thereby block the through hole.

Furthermore, in the present invention, the package main body section is configured such that a first main body section and a second main body section are bonded via the hollow section, the through hole is formed in the second main body section, and the low-melting point section is formed in an entire surface of the second main body section including an inner periphery section of the through hole.

Moreover, in the present invention, the low-melting point section is partly heated and melted by a laser beam, a thickness of the low-melting point section is set so that a volume of the low-melting point section to be melted is greater than a volume of the through hole, and a spot diameter of the laser beam is set greater than a diameter of the through hole.

Furthermore, in the present invention, the low-melting point section is Sn or an alloy material including Sn.

Moreover, in the present invention, the through hole is formed in a tapered shape, a diameter of which gradually becomes smaller with approach from a surface of the package main body section to an opposite side surface.

Furthermore, in the present invention, the through hole is formed in a tapered shape, a diameter of which gradually becomes smaller with approach from a surface of the package main body section to a depth-wise center of the through hole.

Moreover, in the present invention, the through hole is formed so as to be diagonal with respect to a thickness direction of the package main body section.

Furthermore, in the present invention, the package main body section includes a cylindrical section formed in a cylinder shape, and a plate section formed in a plate shape, and the plate section and the cylindrical section are bonded so that the plate section blocks a cylinder hole of the cylindrical section.

Moreover, in the present invention, the hollow section is filled with a nitrogen gas or an inert gas.

Furthermore, in the present invention, the hollow section is vacuumed via the through hole, and the through hole is blocked in a vacuum atmosphere to thereby vacuum encapsulate the electronic device.

Moreover, in the present invention, inside the package main body section, at a position which is contactable with a laser beam irradiated through the through hole, there is mounted a getter material capable of adsorbing gas molecules.

Furthermore, in the present invention, the electronic device is an infrared ray receiving element, and in a portion of the package main body section which opposes to a light receiving section of the infrared ray receiving element, there is provided an infrared ray transmitting hole, and an infrared ray transmitting window material is bonded so as to block the infrared ray transmitting hole.

Moreover, in the present invention, the package main body section includes a wiring substrate, and the electronic device is electrically connected to the wiring substrate.

Furthermore, in the present invention, on a surface of the wiring substrate, there is formed a continuous conductor pattern which surrounds a periphery of the electronic device, and a width of the conductor pattern is wider than a bonding width of a structure to be bonded with the wiring substrate.

Moreover, in the present invention, on a same surface of the wiring substrate as a surface having the electronic device provided thereon, and inside and outside of the hollow section, there is provided an external terminal which is electrically connected to the electronic device.

Furthermore, in the present invention, on a surface of the wiring substrate where the electronic device is provided, and on a surface reverse-opposite of the surface having the electronic device provided thereon, there is formed an external terminal which is electrically connected to the electronic device.

Moreover, in the present invention, Au is formed at least on either one of a surface of the conductor pattern formed on the wiring substrate, and a surface of the external terminal.

Furthermore, in the present invention, the wiring substrate uses a ceramics material or Si for a base material thereof.

Moreover, in the present invention, the package main body section excluding the wiring substrate includes an alloy material including at least Ni.

Furthermore, the present invention the package main body section includes a semiconductor material, a metallic material such as Ni, Fe, Co, Cr, Ti, Au, Ag, Cu, Al, Pd, and Pt, an alloy material having these as a primary component thereof, a glass material, or a ceramics material.

Moreover, a printed circuit board according to the present invention includes an encapsulating package according to any one of claim 1 to claim 20.

Furthermore, an electronic device according to the present invention includes an encapsulating package according to any one of claim 1 to claim 20, or a printed circuit board according to claim 21.

Moreover, the present invention is a method for manufacturing an encapsulating package including a package main body section in which a first main body section and a second main body section are bonded via a hollow section, and an electronic device provided in the hollow section in the package main body section, the method including: a mounting step of mounting an electronic device on the first main body section; a bonding step of bonding the second main body section with the first main body section having the electronic device mounted thereon in the mounting step, so that the electronic device is arranged within the hollow section; and a sealing step of, in a state where the first main body section and the second main body section have been bonded in the bonding step, partly heating a vicinity of a through hole formed in the second main body section, and melting a constituent material of the second main body section, to thereby block the through hole.

Furthermore, the present invention is a method for manufacturing an encapsulating package including a package main body section in which a first main body section and a second main body section are bonded via a hollow section, and an electronic device provided in the hollow section in the package main body section, the method including: a mounting step of mounting an electronic device on the first main body section; a bonding step of bonding the second main body section with the first main body section having the electronic device mounted thereon in the mounting step, so that the electronic device is arranged within the hollow section; and a sealing step of, in a state where the first main body section and the second main body section have been bonded in the bonding step, partly heating a low-melting point section, which is provided in a vicinity of a through hole formed in the second main body section and has a melting point lower than that of the second main body section, and melting the low-melting point section, to thereby block the through hole.

Moreover, the present invention includes: a mounting step of mounting a getter material capable of adsorbing gas molecules, at a position inside the package main body section where it is contactable with a laser beam irradiated through the through hole; a vacuuming step of vacuuming inside of a vacuum chamber where the first main body section and the second main body section bonded in the bonding step are installed, to thereby vacuum inside the hollow section via the through hole; and a heating step of irradiating a laser beam through the through hole to thereby heat the getter material.

Furthermore, in the present invention, the sealing step is performed within a nitrogen atmosphere or in an inert gas atmosphere.

Moreover, the present invention includes a vacuuming step of vacuuming inside of the vacuum chamber where the first main body section and the second main body section bonded in the bonding step are installed, to thereby vacuum inside the hollow section via the through hole, and in the sealing step, a laser beam is irradiated in a vicinity of the through hole from outside of the vacuum chamber through a transmitting window provided in the vacuum chamber, and the through hole is blocked within a vacuum atmosphere, a nitrogen atmosphere, or an inert gas atmosphere.

Furthermore, in the present invention, in the sealing step, a laser beam is irradiated in a vicinity of the through hole, and an irradiation diameter of the laser beam is set greater than a diameter of the through hole.

Moreover, in the present invention, in the sealing step, a laser beam is irradiated in a vicinity of the through hole, and the method of irradiating the laser beam is a method of irradiating the laser beam so as to draw a circle centered on the through hole.

REFERENCE SYMBOLS

Figure 1:
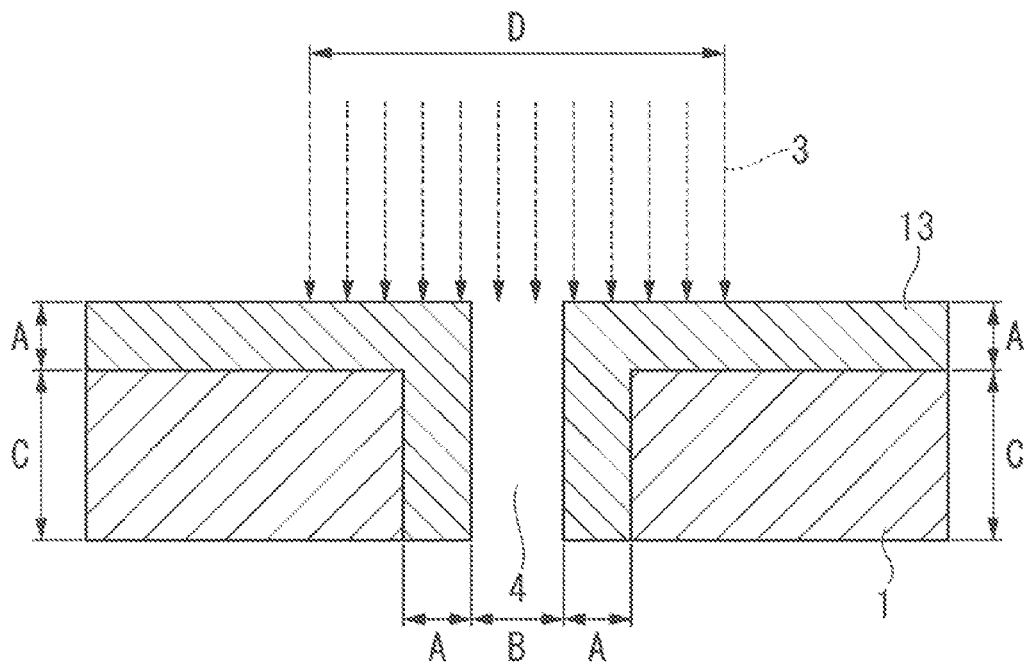
FIG. 1 is a cross-sectional view showing a state of irradiating a laser beam on a metallic layer formed on a structure.

1: Structure (package main body section)
1a: Structure (second main body section)
1b: Structure (first main body section)
4: Through hole
9: Electronic device
10: Sealing section
13: Metallic layer (low-melting point section)
21: Ring-shaped material (cylindrical section)
22: Flat plate (plate-shaped section)
24: Infrared ray sensor (infrared ray receiving element)
26: Conductor pattern
27: Wiring substrate
14, 28: External terminal
25: Infrared ray transmitting window material
32: Printed circuit board
33: Encapsulating package
35: Infrared ray transmitting hole
38: Getter material
39: Laser apparatus
40: Stage inside vacuum chamber

BEST MODE FOR CARRYING OUT THE INVENTION (Exemplary Embodiment 1)

Hereunder, an encapsulating package in a first exemplary embodiment of the present invention is described, with reference to drawings.

Figure 4:
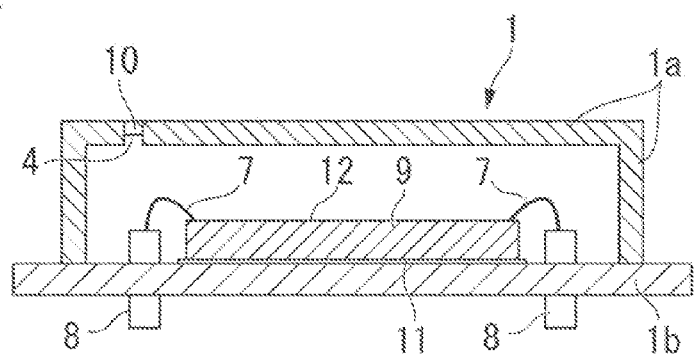
FIG. 4 is a cross-sectional view showing a state where the through hole of FIG. 3 is blocked.
Figure 5:
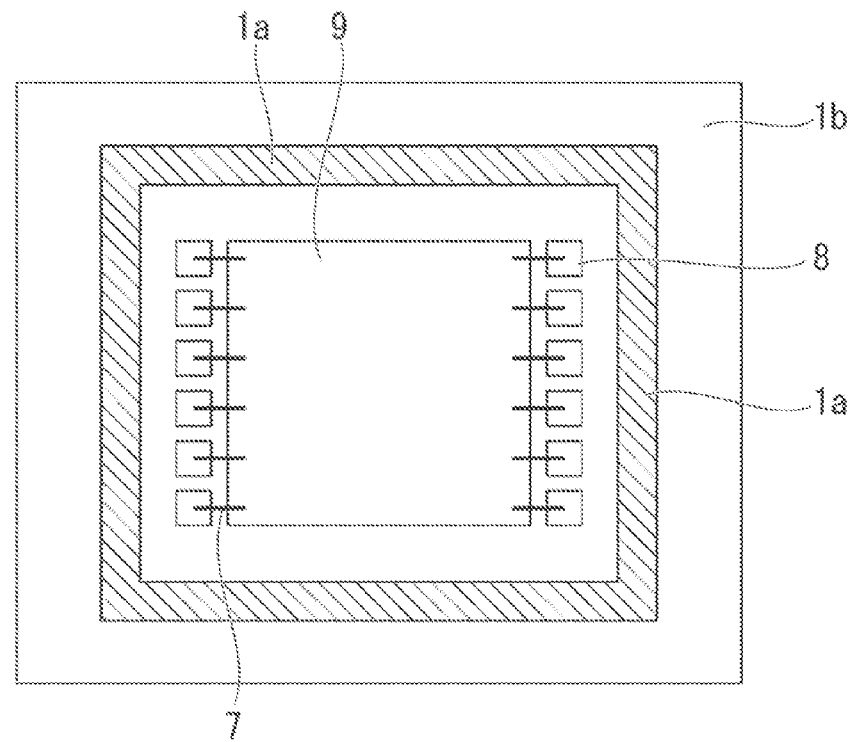
FIG. 5 is a perspective view (illustrated to bring an electronic device 9 into view) seen from the above the encapsulating package of FIG. 3.

FIG. 4 and FIG. 5 show the encapsulating package as the first exemplary embodiment of the present invention.

Figure 3:
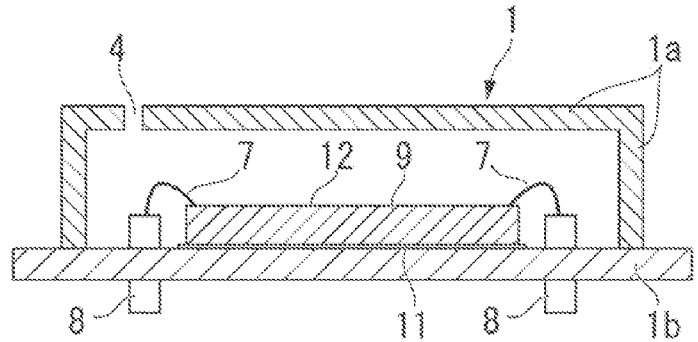
FIG. 3 is a diagram showing an encapsulating package in a first exemplary embodiment of the present invention, and is a cross-sectional view showing a state prior to blocking a through hole.

FIG. 3 shows a state prior to blocking a through hole 4.

The encapsulating package includes a structure (package main body section) serving as a package main body. This package main body section 1 includes a structure (first main body section) 1b formed in a rectangular plate shape, and a structure (second main body section) 1a bonded with this structure 1b.

The structure 1a is formed in a hollow rectangular box shape, and one surface of side surface sections thereof is open. That is to say, the structure 1a is a sectionally channel-shaped surface when seen from a side. Further, the structure 1a and the structure 1b are bonded so as to cover the open portion of the structure 1a.

There are no particular limitations on the material of the structures 1a and 1b. However, a preferred material is a material which is unlikely to release gas after airtight sealing is conducted by local heat application, specifically, a semiconductor material such as Si and Ge, a metallic material such as Ni, Fe, Co, Cr, Ti, Au, Ag, Cu, Al, Pd, and Pt, an alloy material with any of these materials serving as a primary component thereof, or a glass or ceramics material such as $SiO_2$ and $Al_2O_3$. Here, it is preferable to avoid use of a resin material for the material of the structures 1a and 1b. The reason for this is to prevent gas release caused by a process of melting and cooling the constituent material by local heat application to thereby airtightly seal the hole.

The structure 1a and the structure 1b may be bonded via a solder material such as Sn, Pb, SnPb, SnAg, SnCu, SnAgCu, SnIn, SnZn, SnBi, SnZnBi, Bi, In, and InAg. In this case, it is preferable that on the surface of the portion where the structure 1a and the structure 1b are bonded with each other, there is preliminarily formed, by means of a sputtering method, a vapor deposition method, or a plating method, Ni, NiP, Au, Cu, Ag, Fe, Co, Pd, Ti, Cr, or Pt, which prevents solder diffusion or promotes solder wettability, or an alloy with any of these materials serving as a primary component thereof.

The above solder material is supplied between these metallic films, and it is heated and melted using a reflow furnace, a hot plate, or the like, to thereby connect the structure 1a and the structure 1b.

Moreover, there are several other methods for connecting the structure 1a and the structure 1b without using the above solder material. For example, if the combination of materials which constitute the structure 1a and the structure 1b is Si—Si, $SiO_2$—$SiO_2$, Si-glass, glass-glass, or the like, they may be directly bonded by means of anodic bonding or the like. Furthermore, in the case of Si—Si, glass-glass, metal-metal, or the like, surface activated bonding may be employed. Moreover, if the combination is metal-metal, bonding may be conducted by means of a thermal compression bonding method or a welding method, in addition to the surface activated bonding.

Furthermore, Au may be preliminarily film-formed on the surface of the structures 1a and 1b, and the structures 1a and 1b may be bonded in a process of an Au—Au thermal compression bonding, an ultrasonic bonding, a surface activated bonding, or the like.

Moreover, on one principal surface of the structure 1b, which is inside the hollow interior of the structure 1a, there is provided a rectangular plate-shaped electronic device 9.

The electronic device 9 is fixed on the one principal surface of the structure 1b via a bonding material 11 such as an epoxy resin based adhesive film and metallic solder material. Moreover, the electronic device 9 is electrically connected to a pin (output terminal) 8 formed so as to pass through the structure 1b while maintaining airtightness against the structure 1b, by a wire line 7 composed of a material such as Al and Au. As this electronic device 9, for example, a memory element (memory) such as DRAM and flash memory, various types of arithmetic processing devices (processor), a power supply element, a sensor element (pressure sensor, acceleration sensor, acceleration sensor, gyro sensor, hydraulic sensor, infrared ray sensor), or the like may be used with no particular restriction.

Moreover, in the ceiling surface of the structure 1a, there are formed a plurality of through holes 4. The number of the through holes 4 may be appropriately changed, and may be one. The through holes 4 are formed, for example, by methods such as anisotropic etching, isotropic etching, dry etching, drilling, sand blasting, ultrasonic machining, and wire-electrical discharging. In a case where the base material, in which the through holes 4 are formed, is Si, the through holes 4 may be formed by means of anisotropic etching or isotropic etching. That is to say, the through holes may be formed such that a mask or an alkali-resistant resist composed of an $SiO_2$, SiN, SiON, or metallic material is formed on a portion where the through holes 4 are not formed, and then etching is conducted using KOH, TMAH (Tetramethylammonium Hydroxide), hydrazine, EPW (ethylenediamine-pyrocatechol-water), or the like. Furthermore, in a case where the base material is not a silicon material and is a metallic material, a photoresist may be used as the mask material and an acid or alkali may be used as the etching liquid. The method of forming the through holes 4 is common among embodiments described later.

Moreover, the through hole 4 is blocked by a sealing section 10 composed of the material which constitutes the structure 1a. That is to say, the periphery of the through hole 4 is locally heated to a temperature greater than or equal to the melting point of the material constituting the structure 1a and is thereby melted, and it is solidified in a state of blocking the through hole 4 to thereby block the through hole 4. The location where each through hole 4 is blocked becomes the sealing section 10. Furthermore, various examples, including a case of blocking them in the air, a case of blocking them within a nitrogen or inert gas atmosphere, a case of blocking them within a vacuum atmosphere, or the like, may be applied to the through holes 4. In a case where the electronic device 9 is encapsulated in the air (the through holes 4 are blocked in the air), there is no concern of oxidization or erosion caused by the atmosphere outside the structures 1a and 1b. However, it may not pass a long-term reliability test due to oxygen and the minute amount of water content contained in the air inside the structures 1a and 1b in some cases. In this type of case, it is preferable that the through holes 4 are blocked within a nitrogen atmosphere or in an inert gas atmosphere, or they are blocked within a vacuum atmosphere. Since blocking the through holes 4 in the air involves the lowest manufacturing cost, it is preferable to investigate trade-off between reliability and manufacturing cost, and then decide the most suitable atmosphere in which they are to be blocked.

Accordingly, the hollow section of the structure 1 is filled with a nitrogen gas or inert gas or is vacuumed. Therefore, the electronic device can be encapsulated within an environment where there are almost no oxygen and water vapor, and as a result, it is possible to realize a package with superior long-term reliability and low malfunctioning rate.

Moreover, as for the dimension of the through holes 4, the smallest possible dimension is preferable. The reason for this is that if the through hole 4 is large, then the amount of time required for blocking the through hole 4 will become long, and the power of a laser apparatus for blocking the through holes 4 will need be high, consequently making the manufacturing cost high. There is no problem if the inside of the structures 1a and 1b is filled with air. However, if the through hole 4 is too small, there will be a problem in that it is difficult to fill the atmosphere inside the structures 1a and 1b with a nitrogen gas or inert gas, and vacuuming takes a long time if a vacuum atmosphere is needed. Consequently, it is also preferable to decide the size of the through holes 4 based on the cost of the total process.

Figure 6:
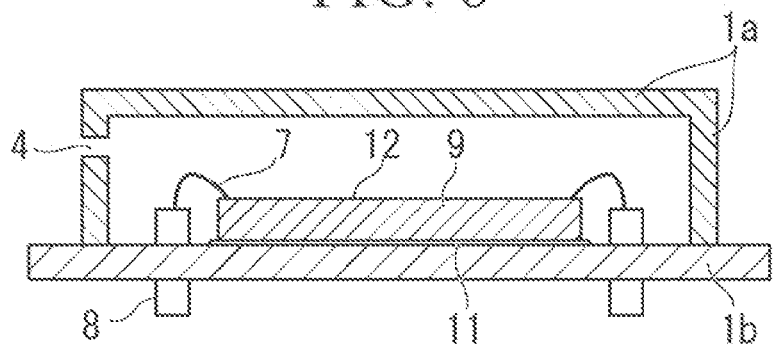
FIG. 6 is a cross-sectional view showing a modified example of FIG. 3.
Figure 7:
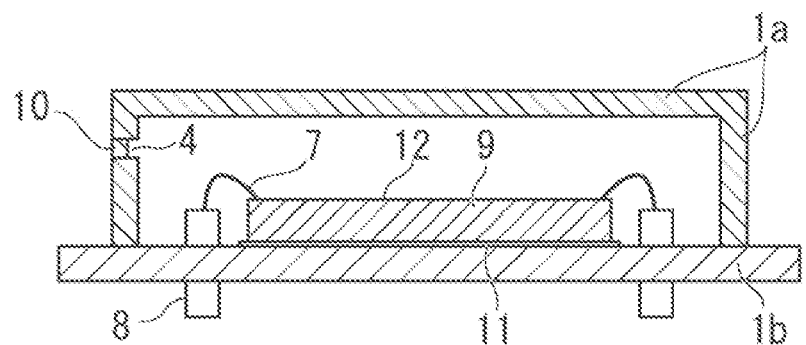
FIG. 7 is a cross-sectional view showing a state where the through hole of FIG. 3 is blocked.
Figure 8:
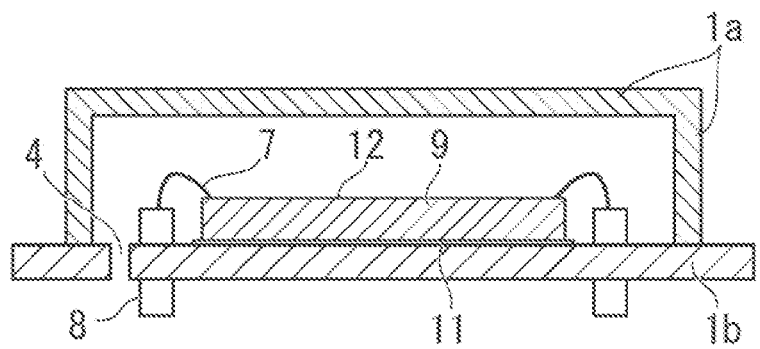
FIG. 8 is a cross-sectional view showing another modified example of FIG. 3.
Figure 9:
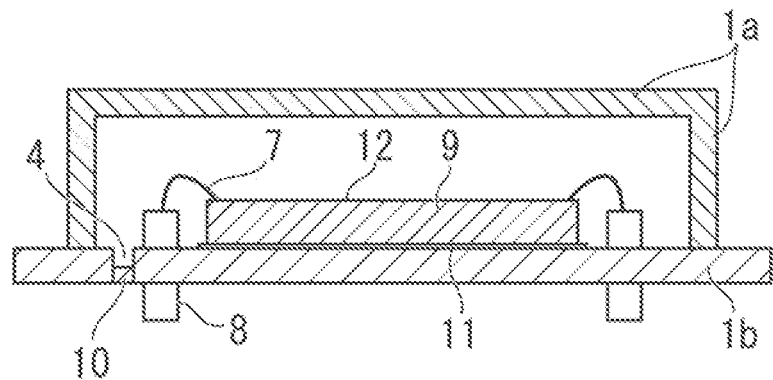
FIG. 9 is a cross-sectional view showing a state where the through hole of FIG. 8 is blocked.

In FIG. 3 and FIG. 4, there is shown a state where a through hole 4 is formed in the ceiling surface of the structure 1a. However, it is not limited to this, and the position of the through hole 4 may be appropriately changed. For example, as shown in FIG. 6, a through hole 4 may be formed in the side surface of the structure 1a, and the through hole 4 may be blocked as shown in FIG. 7 in a manner similar to that described above. Moreover, as shown in FIG. 8, a through hole 4 may be formed in a position in the structure 1b which communicates with the hollow section of the structure 1a, and the through hole 4 may be blocked as shown in FIG. 9 in a manner similar to that described above.

Here, reference symbol 12 denotes a surface on which the electronic device 9 is formed.

Next, there is described a method for manufacturing the encapsulating package in the present embodiment configured in this way.

Figure 10:
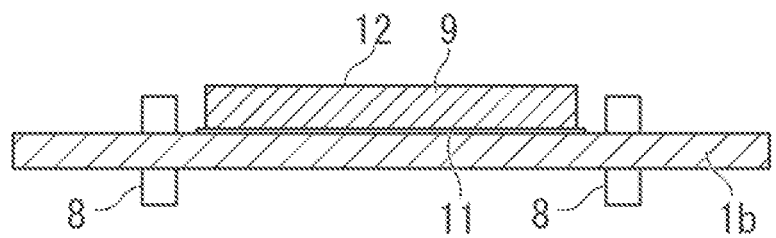
FIG. 10 is a diagram showing a manufacturing method of the encapsulating package of FIG. 3, and is an explanatory diagram showing a state where an electronic device is provided on one principal surface of a structure.
Figure 11:
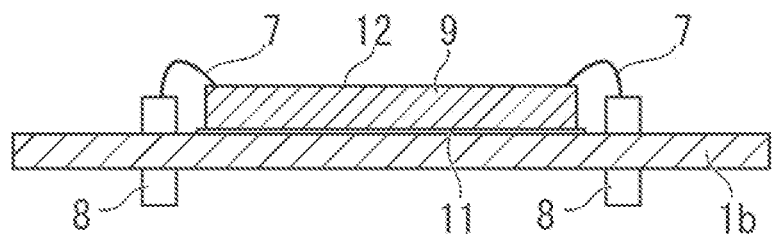
FIG. 11 is an explanatory diagram showing a state where the electronic device of FIG. 10 is connected to a pin.

First, as shown in FIG. 10, the electronic device 9 is mounted (adhesion-fixed) on the structure 1b, using the bonding material 11 such as epoxy resin based adhesive film and metallic solder material. Then, as shown in FIG. 11, the external terminal (omitted in the diagram) of the electronic device 9 and the pin (output terminal) 8 formed in the structure 1b are bonded using the wire line with Al, Au, or the like serving as the primary component thereof.

Figure 12:
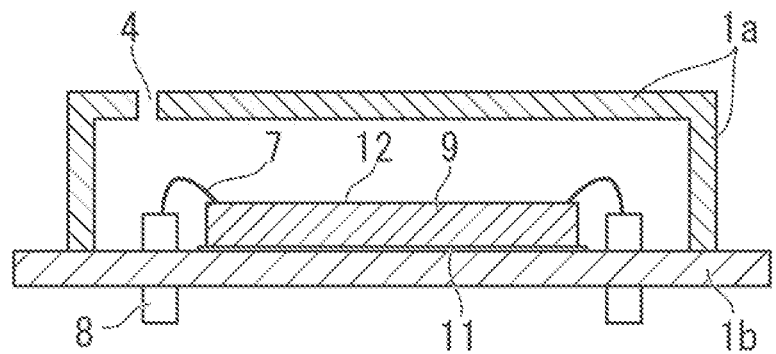
FIG. 12 is an explanatory diagram showing a state where a sectionally channel-shaped structure is bonded with the structure of FIG. 11.

Next, as shown in FIG. 12, in a state where the electronic device 9 is housed within the closed space surrounded by the structure 1a and the structure 1b, the structure 1b and the structure 1a are bonded. The example of the bonding method is as described above.

Figure 13:
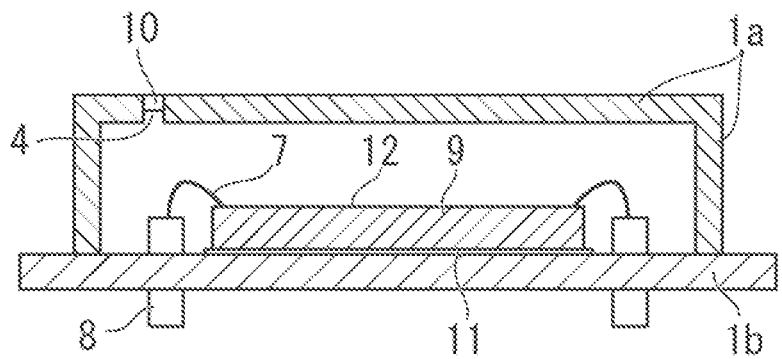
FIG. 13 is an explanatory diagram showing a state where the through hole of FIG. 12 is blocked.
Figure 14:
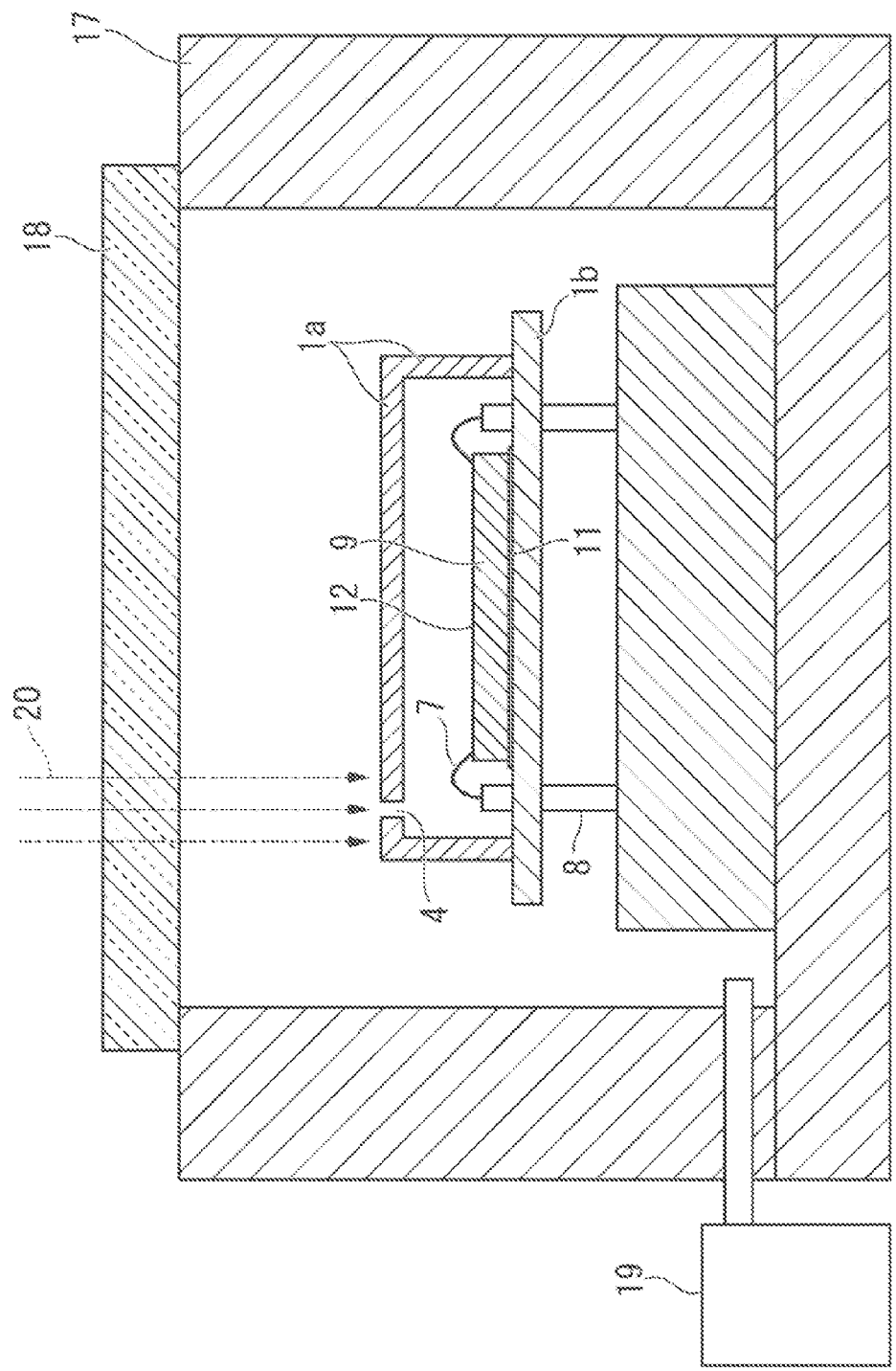
FIG. 14 is an explanatory diagram showing a method in which the inside of an encapsulating package is vacuumed while being placed inside a vacuum chamber, and a laser is irradiated from the outside of the vacuum chamber to the periphery of the through hole of the package through a glass window attached to the vacuum chamber.

In the structure 1 (here, in the structure 1a), there is preliminarily formed a through hole 4 as described above. Accordingly, as shown in FIG. 14, the periphery of the through hole 4 is locally heated by irradiating a laser beam on the periphery of the through hole 4 using a laser apparatus, and it is heated to a temperature greater than or equal to the melting point of the material which constitutes the structure 1a to melt the material and block the through hole 4, thereby manufacturing an airtight encapsulating package shown in FIG. 13.

Here, the step of blocking the through hole 4 may be performed in the air, and may also be performed in a nitrogen atmosphere or in an inert gas (He, Ne, Ar, or the like) atmosphere in order to eliminate oxygen and water content from the surrounding atmosphere of the electronic device 9 to the greatest possible extent. The step of blocking the through hole 4 within a nitrogen atmosphere or inert gas atmosphere may be performed in the space filled with the nitrogen gas or inert gas. Further, it may be performed in a space such that having vacuumed the inside of the vacuum chamber once, a nitrogen gas or an inert gas is supplied into the inside of the vacuum chamber and it is filled with this gas. Furthermore, the through hole 4 may be blocked in a vacuum atmosphere.

In the case of blocking the through hole 4 in a vacuum atmosphere, it is done as described below. That is to say, first, a sample (package) shown in FIG. 12 is installed inside the vacuum chamber, and the inside of the vacuum chamber is vacuumed to thereby evacuate, through the through hole 4, the inside of the closed space surrounded by the structure 1a and the structure 1b. Then, as shown in FIG. 14, a laser beam is irradiated, through a glass window provided in the vacuum chamber, on the periphery of the through hole 4 from the outside of the vacuum chamber. Furthermore, the material is locally heated to a temperature greater than or equal to the melting point of the material constituting the structure 1a and the material is melted, thereby blocking the through hole 4 with the material.

Moreover, in the case of blocking the through hole 4 within a nitrogen atmosphere or within an inert gas atmosphere, it is performed by a method similar to that described above, in which having vacuumed the inside of the vacuum chamber, the above gas may be supplied into the inside of the chamber to thereby fill the chamber.

The method of irradiating a laser beam to heat only the periphery of the through hole 4 offers a manufacturing merit in the points that: the electronic device 9 is not exposed to a high temperature and therefore the characteristic of the electronic device 9 will not be unnecessarily deteriorated, and the location where the structure 1a and the structure 1b are bonded, and the location where the electronic device 9 is bonded with the structure 1b using the bonding material 11 will not be unnecessarily separated.

Moreover, since a laser beam can be irradiated on the periphery of the through hole of the package (before assembly completion) installed inside the vacuum chamber without having to arrange the laser apparatus within a vacuum atmosphere, it is possible to realize a smaller vacuum chamber and realize a more inexpensive vacuum chamber. As a result, it is possible to manufacture a package at a more inexpensive manufacturing cost.

Furthermore, the diameter of the laser beam is preferably greater than the diameter of the through hole 4. The reason for this is that if the diameter of the laser beam is smaller than the diameter of the through hole 4, then there will be employed a method in which a laser beam is irradiated so as to serially trace the outer periphery of the through hole 4 to gradually block the through hole 4. Consequently, the amount of time required for blocking the through hole 4 will become long and the cost for the manufacturing process will become high. On the other hand, if the diameter of the laser beam is greater than that of the through hole 4, it is possible, by aligning the center of the spot diameter of the laser beam with the center of the through hole 4, to reduce the amount of time required for blocking the through hole 4.

Moreover, in the case where a laser beam is irradiated while aligning the spot diameter center of the laser beam with the center of the through hole 4, the laser beam passes through the center of the through hole 4, and therefore, the position of the through hole 4 needs to be preliminarily designed so that the laser beam will not come in contact with the electronic device 9, the wire line 7, the wiring, and so forth.

Furthermore, the number of laser beam shots is higher than that in the above method, and consequently the amount of time required for blocking the through hole 4 becomes long. However, in the step of blocking the through hole 4, there may of course be employed a method of irradiating a laser beam so as to draw a circle centered on the through hole. In the case of this method, since the laser beam will not pass through the through hole 4, there is a merit in that there is no risk of the laser beam coming in contact with the electronic device 9, the wire line 7, the wiring, and so forth present on the inner side of the through hole 4, and the level of freedom is increased in designing the position of the electronic device 9, the wire line, and the wiring.

Moreover, as the laser, a YAG laser is suitable, however, in addition to this, there may be used any type of laser capable of melting the material to be melted, such as a ruby laser, a carbon dioxide gas laser, an excimer laser, a liquid laser, a semiconductor laser, and a free electron laser. As for the laser, it is similar among all of the embodiments in the present specification.

Thus, according to the encapsulating package in the present embodiment, since the constituent material of the through hole periphery is directly melted by local heat application such as laser beam irradiation to thereby block the through hole 4, there is no need for a process of a conventional technique in which a third fixing material for blocking the through hole is arranged over the through hole, and the manufacturing cost can be reduced.

(Exemplary Embodiment 2)

Next, a second exemplary embodiment of the present invention is described.

Figure 15:
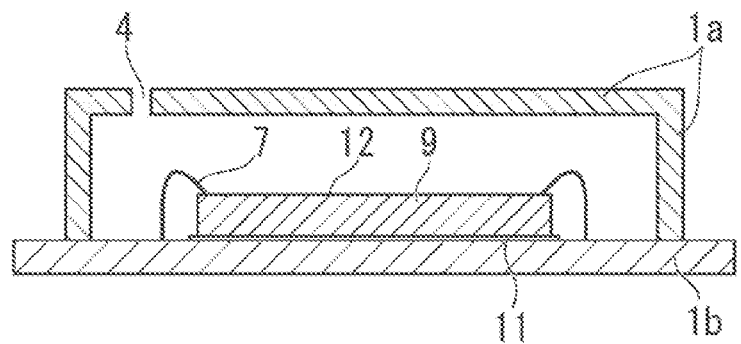
FIG. 15 is a diagram showing an encapsulating package in a second exemplary embodiment of the present invention, and is a cross-sectional view showing a state prior to blocking a through hole.
Figure 16:
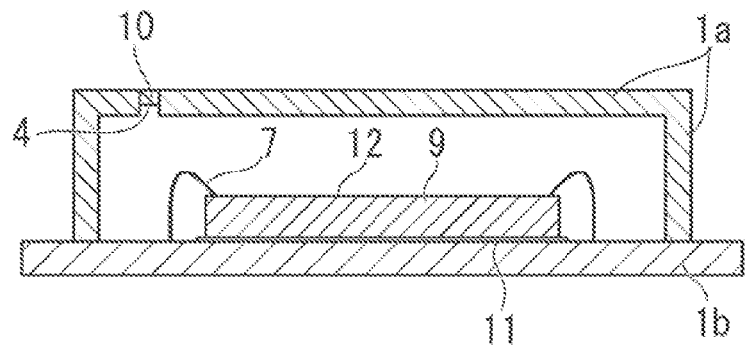
FIG. 16 is a cross-sectional view showing a state where the through hole of FIG. 15 is blocked.

FIG. 15 and FIG. 16 show the second exemplary embodiment of the present invention.

In FIG. 15 and FIG. 16, the same reference symbols are given to portions the same as constituents described in FIG. 1 to FIG. 4, and descriptions thereof are omitted.

The basic configuration of this embodiment is the same as that of the first exemplary embodiment described above, and points of difference therebetween are mainly described here.

FIG. 16 is a cross-sectional view showing an encapsulating package in the second exemplary embodiment of the present invention.

FIG. 15 is a cross-sectional view showing a state of a through hole 4 in FIG. 16 prior to being blocked.

In the first exemplary embodiment of the present invention shown in FIG. 4 and FIG. 5, there is illustrated the example of the electronic device 9 being electrically connected to the pin (output terminal) 8 by the wire line 7. On the other hand, in the encapsulating package in the second exemplary embodiment shown in FIG. 15 and FIG. 16, an electronic device 9 is connected to an external terminal (omitted in the diagram) of a structure 1b, and the structure 1b itself functions as a circuit board.

Moreover, although omitted in the diagram, there may be provided a configuration connected by a so-called flip-chip mounting method, in which the structure 1b is a circuit board, and a circuit surface of the electronic device 9 faces the structure 1b (circuit board).

As the circuit board, use of a wiring substrate which uses a ceramics material such as glass ceramics or alumina, or Si for the base material thereof, is preferred. The reason for this is that the base material used in this type of wiring substrate has a low coefficient of linear expansion (approximately 3 to 4 ppm), and therefore the difference in coefficient of linear expansion between the wiring substrate and the electronic device 9 (circuit is formed on a base substrate composed of Si in general) is small. As a result, it is possible to realize a package with a high level of long-term reliability. Moreover, if the above material is used as the base material, there is a merit in that outgassing from the base material is lower compared to the case of using a resin material for the base material, and it is possible to prevent deterioration in the level of vacuum after manufacturing the vacuum encapsulating package.

(Exemplary Embodiment 3)

Next, a third exemplary embodiment of the present invention is described.

Figure 17:
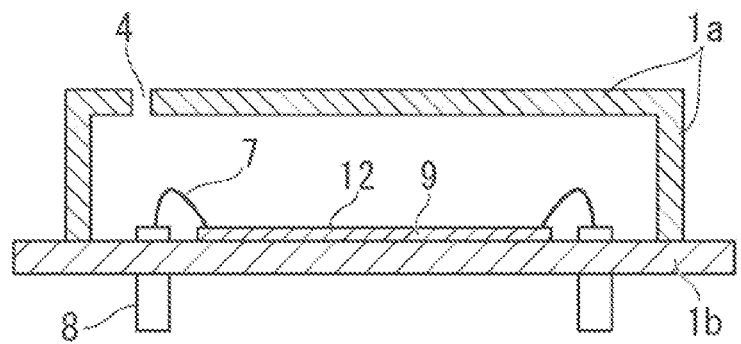
FIG. 17 is a diagram showing an encapsulating package in a third exemplary embodiment of the present invention, and is a cross-sectional view showing a state prior to blocking a through hole.
Figure 18:
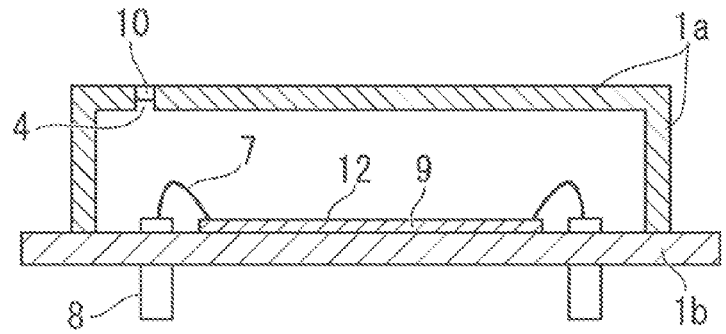
FIG. 18 is a cross-sectional view showing a state where the through hole of FIG. 17 is blocked.

FIG. 17 and FIG. 18 show the third exemplary embodiment of the present invention.

In FIG. 17 and FIG. 18, the same reference symbols are given to portions the same as constituents described in FIG. 1 to FIG. 16, and descriptions thereof are omitted.

The basic configuration of this embodiment is the same as that of the first exemplary embodiment described above, and points of difference therebetween are mainly described here.

FIG. 18 is a cross-sectional view showing an encapsulating package in the third exemplary embodiment of the present invention.

FIG. 17 is a cross-sectional view showing a state of a through hole 4 in FIG. 18 prior to being blocked.

The first and second exemplary embodiments illustrates the examples of the electronic device 9 being mounted on the structure 1b via the bonding material 11. On the other hand, the encapsulating package in the third exemplary embodiment of the present invention shown in FIG. 17 and FIG. 18 is such that an electronic device 9 (electronic circuit) is formed directly on a structure 1b serving as a substrate.

In this case, there is a merit in that the package can be made thin as the electronic device 9 (electronic circuit) formed directly on the structure 1b has a thin thickness (several 10 μm), and there is also a merit in that gas release inside the package is unlikely after it has been airtightly sealed as there is no need for using a bonding material 11.

Figure 19:
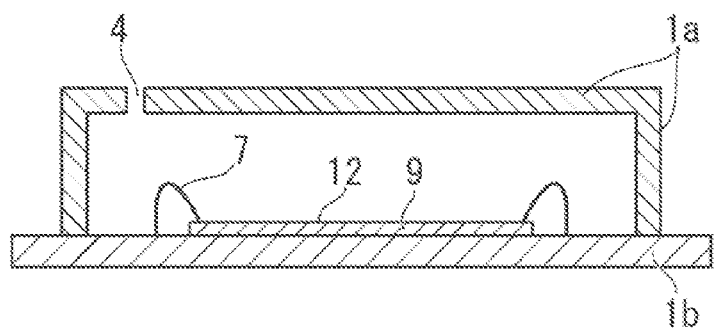
FIG. 19 is a cross-sectional view showing a modified example of FIG. 17.
Figure 20:
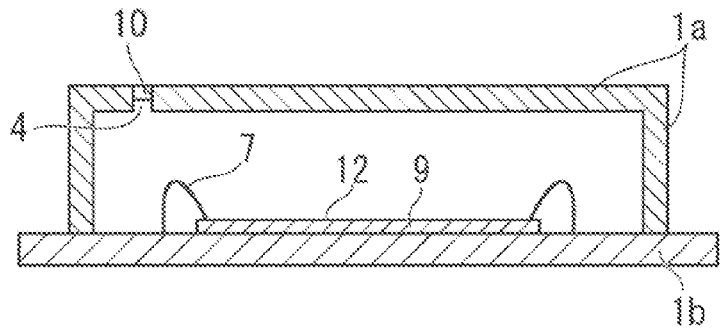
FIG. 20 is a cross-sectional view showing a state where the through hole of FIG. 19 is blocked.

As shown in FIG. 19 and FIG. 20, the electronic device 9 may be connected to an external terminal (omitted in the diagram) of the structure 1b, and the structure 1b itself may function as a circuit board (wiring substrate: a substrate having a wiring pattern formed thereon).

According to this configuration, the external terminal (thin and flat pad) is provided on both surfaces of the wiring substrate, and therefore, there is no need for providing an output terminal (pin) in the package main body section, and it is possible to realize a small and thin encapsulating package. In general, it is difficult to miniaturize the pin (it is difficult to make the outer size 1 mm or less as with the pad of the wiring substrate) and make it thin (it also has a thickness of several millimeters or more), and therefore, it has a disadvantage for miniaturizing an encapsulating package and making it thin.

Figure 42:
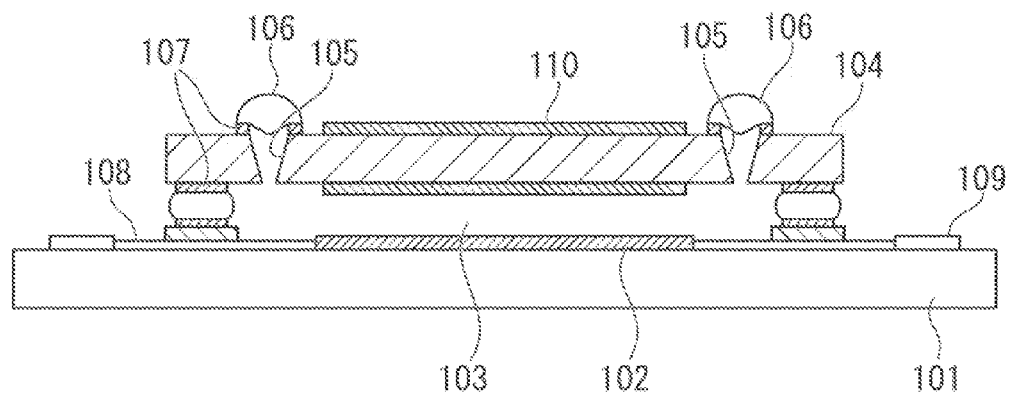
FIG. 42 is a cross-sectional view showing a conventional vacuum encapsulating package.

Moreover, in the example shown in FIG. 42, light receiving sections are formed directly on a silicon substrate. That is to say, a plurality of light receiving sections are formed on a silicon wafer, and finally it is diced into individual pieces to thereby manufacture a light receiving device. However, with this type of structure, in the light receiving device (individual piece), there is required a region where a transmitting window, which surrounds the periphery of the light receiving section, is mounted. Consequently, the area of a single light receiving device (individual piece) becomes large, and the number of light receiving devices which can be manufactured from a single silicon wafer becomes small. As a result, the per-piece cost for the single light receiving device becomes high. In addition, a process of forming the light receiving device involves a number of steps, and therefore, there is a significant impact of an increase in the manufacturing cost of the light receiving device caused by an increase in the outer size of the light receiving device. In contrast, the manufacturing cost of the wiring substrate is inexpensive, and there is a merit in that the structure of the encapsulating package according to the present invention is less expensive compared to the structure of the example illustrated in FIG. 42.

(Exemplary Embodiment 4)

Next, a fourth exemplary embodiment of the present invention is described.

Figure 21:
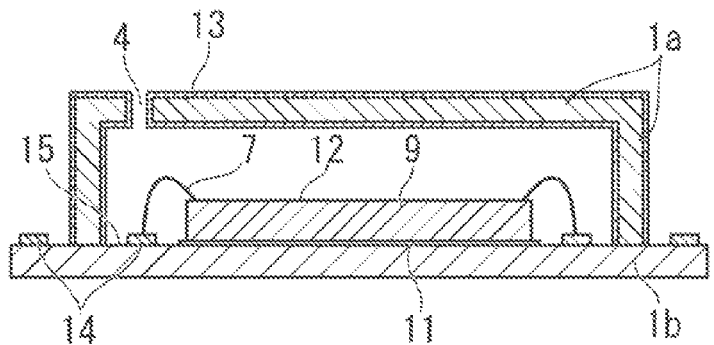
FIG. 21 is a diagram showing an encapsulating package in a fourth exemplary embodiment of the present invention, and is a cross-sectional view showing a state prior to blocking a through hole.
Figure 22:
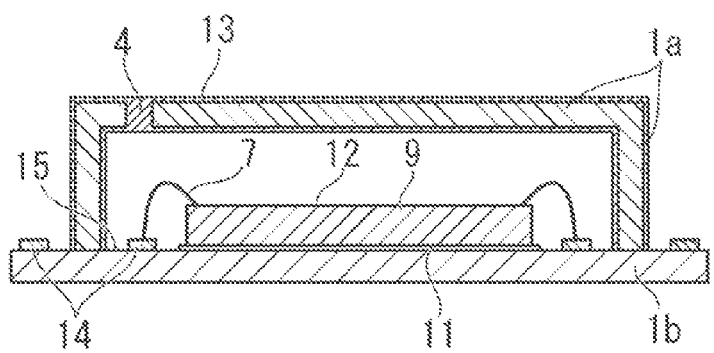
FIG. 22 is a cross-sectional view showing a state where the through hole of FIG. 19 is blocked.

FIG. 21 and FIG. 22 show the fourth exemplary embodiment of the present invention.

In FIG. 21 and FIG. 22, the same reference symbols are given to portions the same as constituents described in FIG. 1 to FIG. 20, and descriptions thereof are omitted.

The basic configuration of this embodiment is the same as that of the first exemplary embodiment described above, and points of difference therebetween are mainly described here.

FIG. 22 is a cross-sectional view showing an encapsulating package in the fourth exemplary embodiment of the present invention.

FIG. 21 is a cross-sectional view showing a state of a through hole 4 in FIG. 22 prior to being blocked.

In the present embodiment, a wiring substrate is used for a structure 1b, and there is a difference in the position of an external terminal 14 of the wiring substrate. In the example shown in FIG. 22, on a surface the same as a surface (one principal surface) 15 of the wiring substrate (corresponding to the structure 1b here), on which an electronic device 9 is mounted, and both inside and outside the closed space surrounded by the structure 1, there is formed an external terminal 14 electrically connected to the electronic device 9.

This airtightly encapsulating package is further connected electrically to another circuit board via the external terminal 14 which is present outside the structure 1a, by a connection means such as wire bonding.

Figure 43:
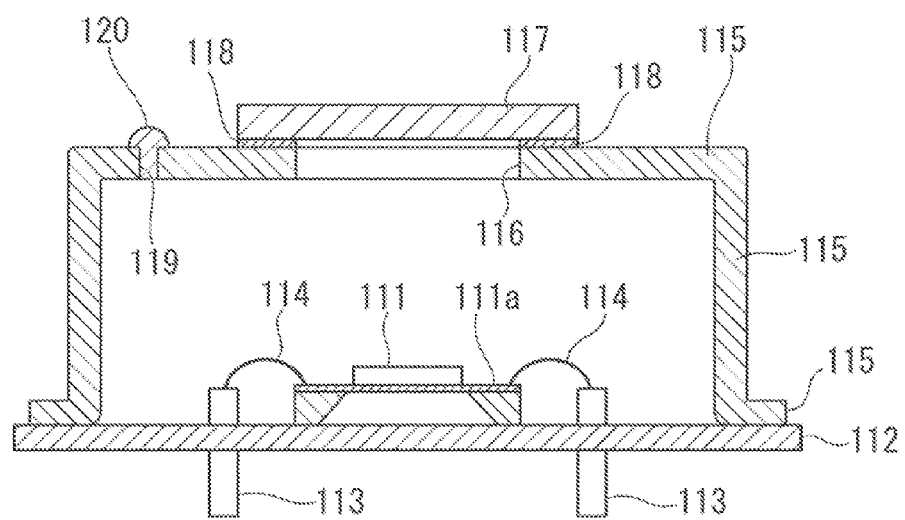
FIG. 43 is a cross-sectional view showing another conventional vacuum encapsulating package.
Figure 44:
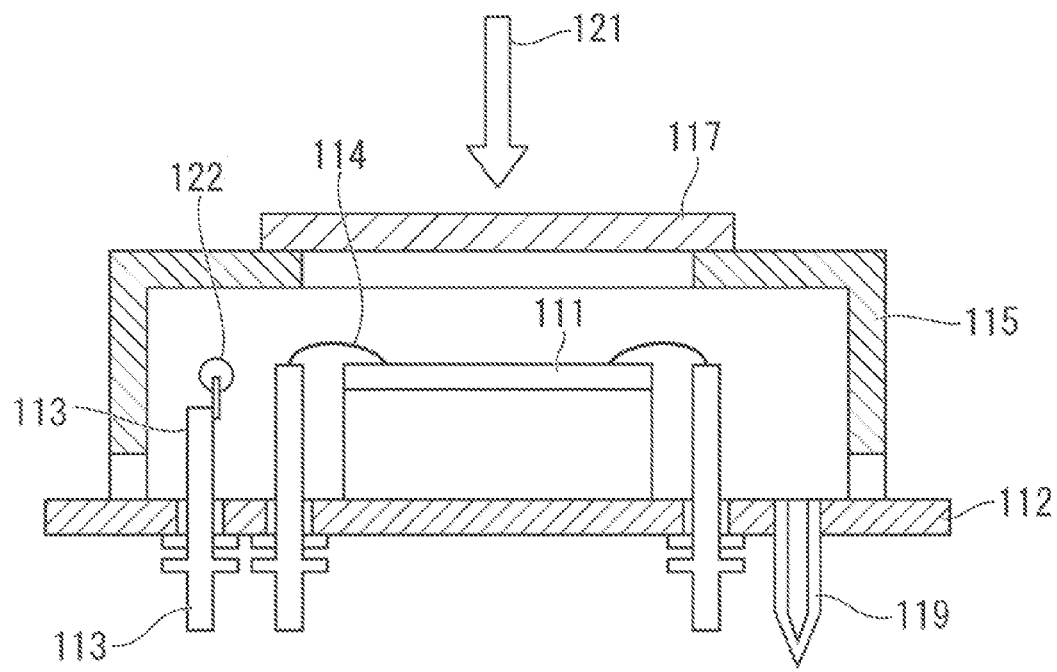
FIG. 44 is a cross-sectional view showing still another conventional vacuum encapsulating package.
Figure 45:
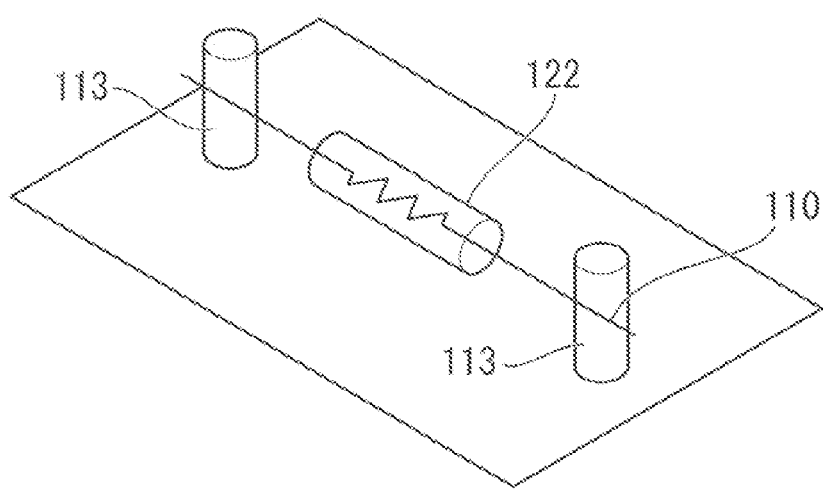
FIG. 45 is a cross-sectional view showing still another conventional vacuum encapsulating package.
Figure 46:
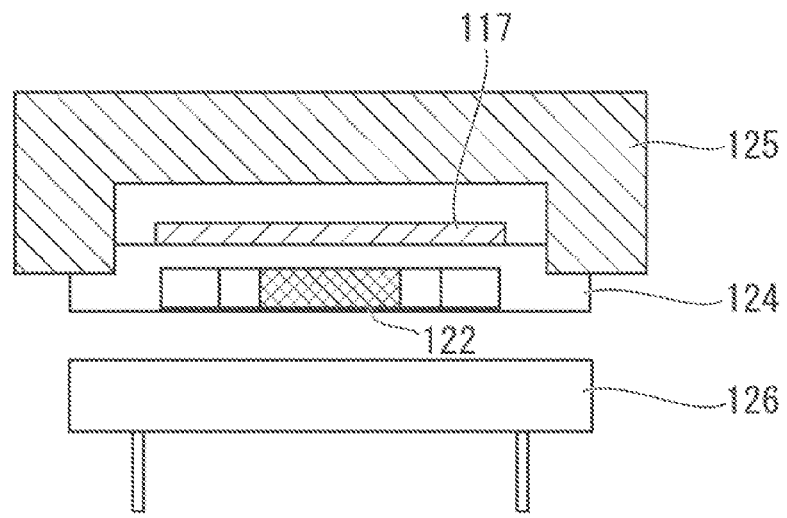
FIG. 46 is a cross-sectional view showing still another conventional vacuum encapsulating package.
Figure 47:
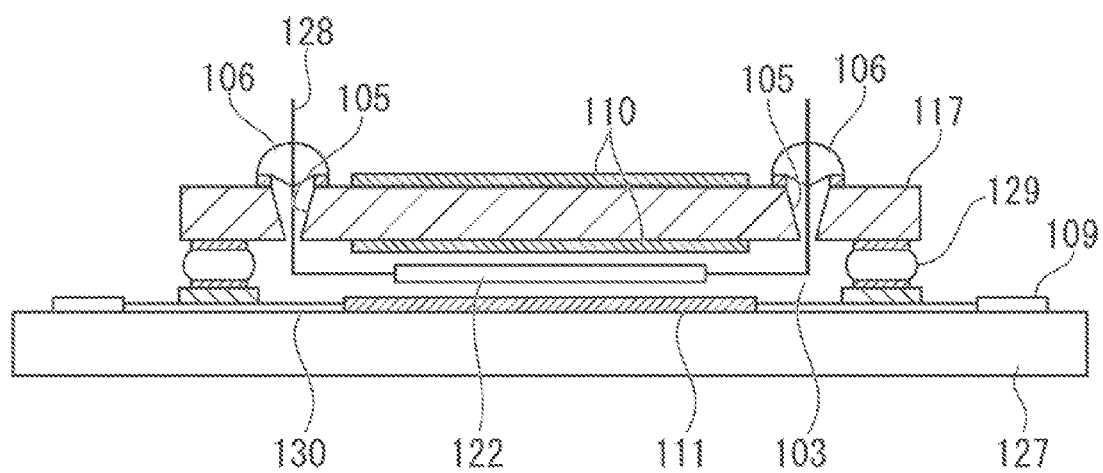
FIG. 47 is a cross-sectional view showing still another conventional vacuum encapsulating package.
Figure 48:
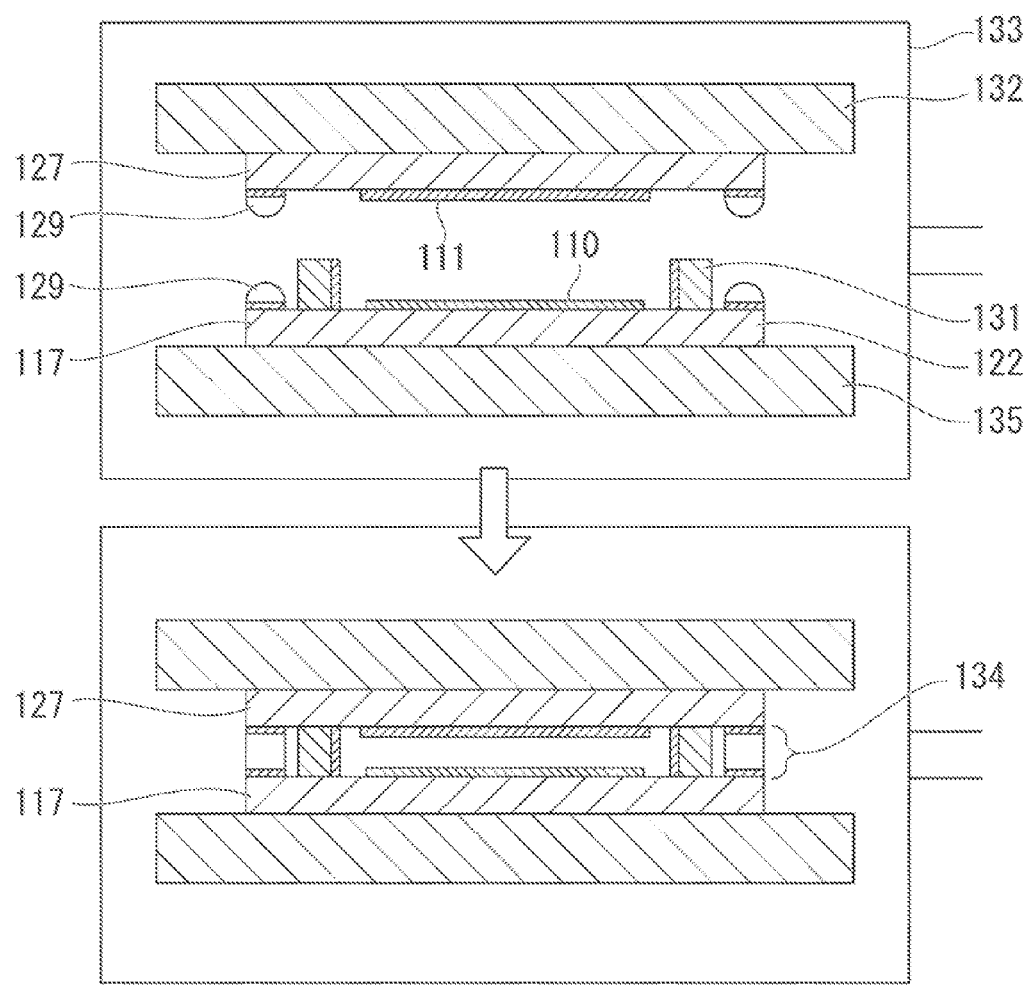
FIG. 48 is a cross-sectional view showing still another conventional vacuum encapsulating package.

According to this configuration, the external terminal electrically connected to the electronic device is formed, outside the hollow section, on the surface the same as the surface having the electronic device mounted thereon. Therefore, it is possible to realize a package thinner than the package shown in FIG. 43 which uses a pin (output terminal).

Figure 23:
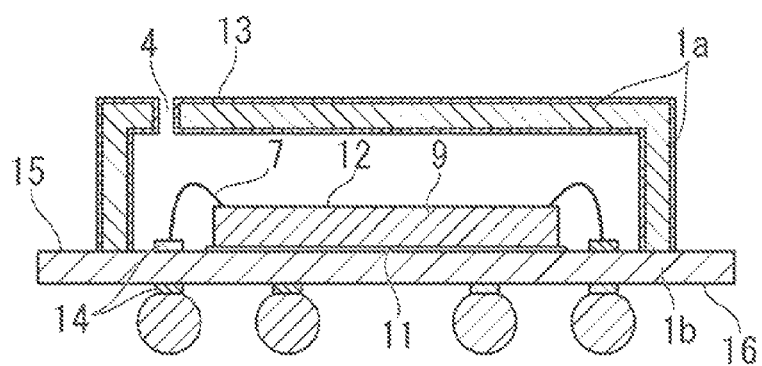
FIG. 23 is a cross-sectional view showing a modified example of FIG. 21.
Figure 24:
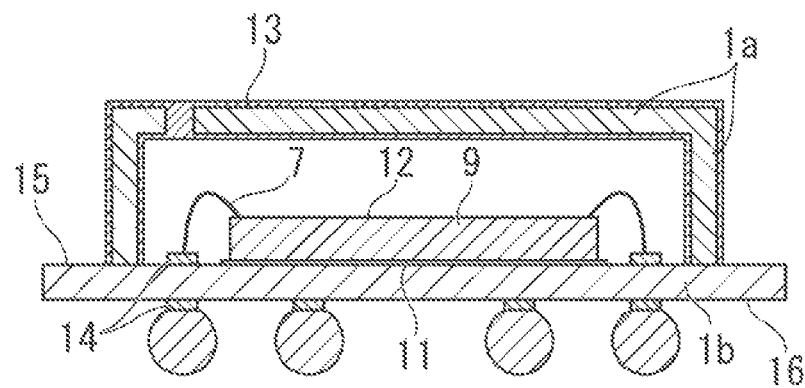
FIG. 24 is a cross-sectional view showing a state where the through hole of FIG. 23 is blocked.

Also, this may be modified as shown in FIG. 23 and FIG. 24. That is to say, in the example shown in FIG. 24, on the surface 15 of the wiring substrate (corresponding to the structure 1b here) where the electronic device 9 is mounted, and on a surface 16 reverse-opposite of this surface 15, there is formed an external terminal 14 electrically connected to the electronic device 9.

In the example shown in FIG. 24, an external terminal is formed also on the surface 16 reverse-opposite of the surface 15 having the electronic device 9 mounted thereon, and if an electric conductor such as a solder ball (a conductive ball composed of a material such as Sn, SnPb, SnAg, SnAgCu, SnCu, SnIn, SnZn, SnBi, and SnZnBi) is formed by means of reflowing or the like, it is possible to realize a package capable of flip-flop mounting. In this case, there is a merit in that it can be made smaller compared to the structure of FIG. 22 as the external terminal 14 does not have to be formed on the outermost periphery section of the package.

Moreover, as the wiring substrate, use of a wiring substrate which uses a ceramics material such as glass ceramics or alumina, or Si for the base material thereof, is preferred. The reason for this is that, as described in the second exemplary embodiment of the present invention, these base materials have a low coefficient of linear expansion (approximately 3 to 4 ppm), and therefore the difference in coefficient of linear expansion between the wiring substrate and the electronic device 9 (circuit is formed on a base substrate composed of Si in general) is small. As a result, it is possible to realize a package with a high level of long-term reliability.

Furthermore, in the embodiment of the present invention, it is preferable that the structure 1a excluding the wiring substrate includes a structure manufactured with an alloy material such as kovar and 42 alloy which at least contains Ni. An alloy material such as kovar and 42 alloy which at least contains Ni has a low coefficient of linear expansion (approximately 3 to 4 ppm), and as a result, it is possible to realize a package with a high level of long-term reliability. Moreover, since an alloy material such as kovar and 42 alloy which at least contains Ni is a magnetic material, this has a magnetic shielding effect. As a result, no electromagnetic interference from another electronic device mounted outside the structure which encapsulates the electronic device 9 is received, and therefore, there is a merit in that a stable operation can be realized. On the other hand, in a case where the electronic device 9 encapsulated in the structure emits strong electromagnetic waves, there is a merit in that interference of the electromagnetic waves with another electronic device mounted outside the structure 1 can be prevented. Furthermore, since these materials are metallic materials and are electric conductors, there is a merit in that in the case where a metallic layer (metallic film), the type of which differs from these materials, needs to be formed on the surface, it is possible to use an electro (electrolytic) plating method which is capable of forming a thick metallic layer in a shorter period of time and at lower cost compared to those of the sputtering method and vapor deposition method.

Moreover, in the present embodiment, manufacturing is conducted such that on the surface of the structure 1a (including the interior of the through hole 4), there is preliminarily formed a metallic layer (low-melting point section) 13, the melting point of which is lower than that of the material constituting the structure 1a, and this metallic layer 13 is heated and melted by a local heat application method such as laser beam irradiation, to thereby block the through hole.

The metallic layer 13 is formed by means of an electrolytic plating method, nonelectrolytic plating method, sputtering method, vapor deposition method, or the like. If the structure 1a is an electric conductor such as metal, manufacturing conducted by the electrolytic method is preferable in terms of manufacturing cost.

Furthermore, for the metallic layer 13, a so-called solder material such as Sn or Sn-containing alloy (SnPb, SnAg, SnCu, SnAgCu, SnIn, SnZn, SnBi, and SnZnBi), the melting point of which is low among metallic materials, is preferable. Since these materials have a melting point of 300° C. or lower and have a high energy absorption rate for a laser beam, it is possible, when performing local heat application using a laser beam, to melt the metallic layer 13 with use of a laser apparatus of lower power specification, and the equipment investment cost for the manufacturing apparatus can be made lower.

Furthermore, since the metallic layer 13 with a low melting point is used, the length of laser irradiation time can be reduced and the process cost can be reduced.

Moreover, the examples of FIG. 21 to FIG. 24 show an example of the metallic layer 13 being formed on the entire surface of the structure 1a. However, it may be formed only on the periphery of the through hole 4 and inside the through hole 4. From the aspect of the manufacturing cost, it is more preferable to form the metallic layer 13 on the entire surface of the structure 1a as shown in FIG. 21 to FIG. 24 because the mask cost is not needed and therefore this can be conducted inexpensively.

That is to say, since the metallic layer 13 is formed on the entire surface of the structure 1 including the through hole 4, there is no need for a process with use of a mask compared to the structure having a metallic film partly formed thereon. As a result, an inexpensive airtightly encapsulating package can be realized. Moreover, by forming the metallic layer 13 on the entire surface, the metallic layer 13 can not only function as a material which blocks the through hole 4 but also function as a material which bonds the structures 1a and 1b. Consequently, with just a single process of forming the metallic layer 13, it is possible to inexpensively realize an encapsulating package, compared to the case of separately forming a fixing material which bonds the structures with each other.

Furthermore, if the metallic layer 13 is also formed inside the through hole 4 as with the present invention, the material of the metallic layer 13 melted by heat application wetly spreads out well also inside the hole, and there is a merit in that the through hole 4 can be reliably blocked. If the metallic layer 13 is absent inside the through hole and the material of the structure 1a itself is exposed, a wettability defect occurs on the metallic layer 13, and it takes a long time when blocking the inside of the hole.

Moreover, in the case of the structure of the exemplary embodiment 1 (the structure in which the metallic layer 13 is not formed, and the constituent material of the structure 1 is melted to thereby block the through hole 4), the size of the through hole 4 needs to be a small size of approximately 100 μm or less (blocking becomes difficult if the hole is large). However, taking into account the strength of drill teeth, it is difficult to form a through hole 4 of 100 μm or less, for example, in a machining process.

On the other hand, in the case of the encapsulating package shown in FIG. 21 to FIG. 24, if the through hole 4 to be formed in the structure 1a has a diameter of approximately 200 μm, which can be easily formed in a machining process, and then the metallic layer 13 is formed with a thickness of 70 μm on the surface of the structure 1 including the inside the hole, it is possible to easily form a hole with a diameter of 60 μm. Further, if the diameter of the hole is 60 μm, the through hole can be easily blocked by melting the metallic layer 13.

Moreover, in the exemplary embodiment of the present invention, there is no need for a process of arranging a third fixing material over the through hole 4, and therefore, the number of manufacturing steps becomes smaller, and it is possible to realize a more inexpensive airtightly encapsulating package.

Furthermore, in the case of the exemplary embodiment of the present invention, it is preferable that dimensions A, B, C, and D are defined as dimensions which satisfy the following inequations, where A is taken as the thickness of the metallic layer 13, B is taken as the diameter of the through hole 4 after the metallic layer 13 has been formed, C is taken as the thickness of the structure 1a with the through hole 4 formed therein, and D is taken as the spot diameter of laser beam.

$$CB^2/(D^2-B^2) \leq A$$

$$B < D$$

Here, the above inequations are described in detail below, with reference to FIG. 1 and FIG. 2.

Figure 2:
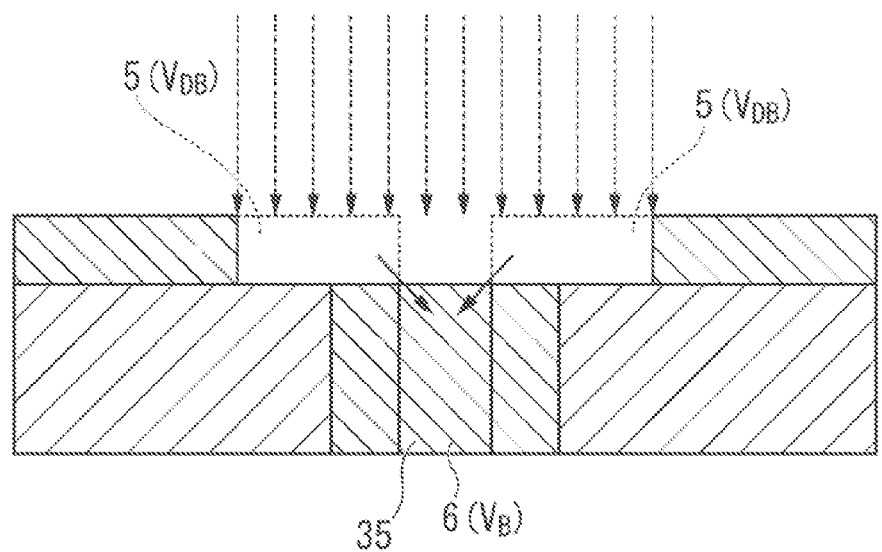
FIG. 2 is a cross-sectional view showing a state where the metallic layer heated by the laser beam of FIG. 1 is blocking a through hole.

FIG. 1 is a cross-sectional view showing a state of a laser beam 3 being irradiated on the metallic layer 13 formed on the structure 1. FIG. 2 is a cross-sectional view showing a state where the metallic layer 13 heated by the laser beam 3 is blocking the through hole 4.

A, B, C, and D are respectively the thickness of the metallic layer 13, the diameter of the through hole 4 after the metallic layer 13 has been formed, the thickness of the structure having the through hole 4 formed therein, and the spot diameter of the laser beam 3.

If the portion where the laser beam 3 and the metallic layer 13 are in contact with each other is assumed to be a circle with a diameter D, the following formula (1) denotes a volume 5 ($V_{D-B}$) of the metallic layer 13 which receives irradiation of the laser beam 3, is heated to a temperature greater than or equal to the melting point, and is melted to block the through hole 4.

$$V_{D-B} = \pi A(D^2-B^2)/4 \quad (1)$$

Moreover, the following formula (2) denotes a volume 6 (VB) of the through hole 4 blocked with the metallic layer 13.

$$V_B = \pi CB^2/4 \quad (2)$$

Here, in order to completely fill the through hole 4 with the metallic layer 13, the following formula (3) needs to be satisfied.

$$V_B \leq V_{D-B} \quad (3)$$

Therefore, substituting the formulas (1) and (2) for the values of the formula (3), and re-organizing it yields the following formula (4).

$$CB^2/(D^2-B^2) \leq A \quad (4)$$

Moreover, the spot diameter D of the laser beam 3 needs to be greater than the diameter B of the through hole 4 in order to heat the metallic layer 2 on the periphery of the through hole 4, and therefore, it needs to satisfy the condition denoted by the following formula (5).

$$B < D \quad (5)$$

That is to say, the thickness A of the metallic layer 13 is set so that the volume ($V_{D-B}$) of the metallic layer 13 to be melted becomes greater than or equal to the volume ($V_B$) of the through hole 4, and the spot diameter D of the laser beam 3 is set so as to be greater than the diameter B of the through hole 4.

As described above, according to this configuration, by preliminarily designing the thickness A of the metallic layer 13, the diameter B of the through hole 4 after the metallic layer 13 has been formed, the thickness C of the structure having the through hole 4 formed therein, and the spot diameter D of the laser beam 3 so as to satisfy the formulas (4) and (5), it is possible to reliably block the through hole 4 with the metallic layer 13, and realize a package with high manufacturing yield.

Furthermore, according to this encapsulating package, by conducting local heat application such as laser beam irradiation on the metallic layer 13 preliminarily formed on the periphery of the through hole 4 and inside the through hole 4, it is possible to melt only the metallic layer 13 to thereby block the through hole 4. Therefore, it is possible to eliminate the need for a process of arranging the third fixing material over the through hole 4, and as a result, it is possible to realize a more inexpensive airtightly encapsulating package.

Moreover, since the melting point of the metallic layer 13 is lower than the constituent material of the structure 1, manufacturing can be conducted with use of a laser apparatus of lower power specification, and the equipment investment cost for the apparatus can be made lower. Furthermore, with use of the metallic layer 13 having a lower melting point, the length of laser heat application time can be reduced and therefore the process cost can be reduced. As a result, it is possible to realize a more inexpensive airtightly encapsulating package.

Furthermore, by having the metallic layer 13 composed of Sn or a Sn-containing alloy material, the melting point of the metallic layer 13 can be lowered to a temperature of approximately 220° C. (if the constituent material of the structure is glass, ceramics, Si, Cu, Al, or the like, the melting point of these materials is approximately 1,000° C. or higher). Therefore, the heat application temperature can be lowered, the amount of time required for blocking the through hole 4 can be reduced, and also the power of the apparatus required for heat application can be reduced. Therefore the manufacturing cost of the apparatus can be reduced. As a result, it is possible to manufacture a more inexpensive package.

(Exemplary Embodiment 5)

Next, a fifth exemplary embodiment of the present invention is described.

Figure 25:
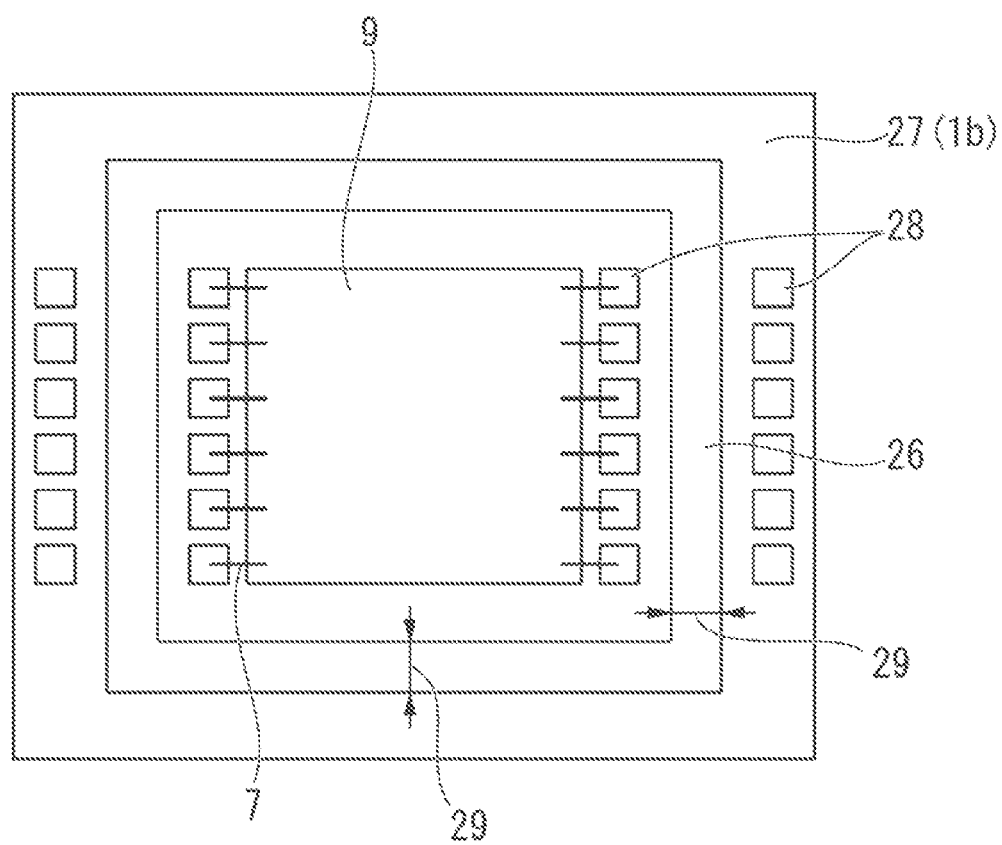
FIG. 25 is a plan view showing an encapsulating package in a fifth exemplary embodiment of the present invention.
Figure 26:
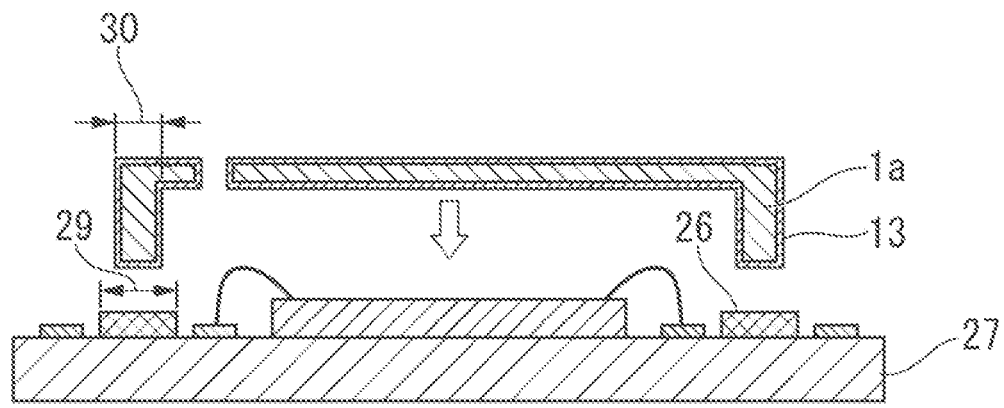
FIG. 26 is an explanatory diagram showing a state where structures of FIG. 25 are bonded with each other.
Figure 27:
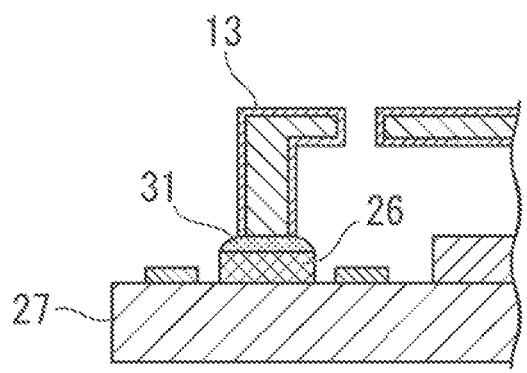
FIG. 27 is an enlarged cross-sectional view showing a state of the structures of FIG. 26 being bonded with each other.

FIG. 25 to FIG. 27 show the fifth exemplary embodiment of the present invention.

In FIG. 25 to FIG. 27, the same reference symbols are given to portions the same as constituents described in FIG. 1 to FIG. 24, and descriptions thereof are omitted.

The basic configuration of this embodiment is the same as that of the first exemplary embodiment described above, and points of difference therebetween are mainly described here.

There is described a width 29 of a conductor pattern 26 which surrounds the periphery of an electronic device 9 formed on a wiring substrate 27 according to the fifth exemplary embodiment of the present invention.

In the case of using the wiring substrate 27 for the structure 1b as with the second to fourth exemplary embodiments of the present invention, the continuous conductor pattern 26 which surrounds the periphery of the electronic device 9 is formed on the surface of the wiring substrate 27. As shown in FIG. 25 and FIG. 26, the width 29 of this conductor pattern is greater than a bonding width 30 of the structure body 1a bonded with the wiring substrate 27 (the structure 1b here).

By using this type of structure, the structure 1b is bonded with the continuous conductor pattern 26 formed on the surface of the wiring substrate 27 so as to surround the periphery of the electronic device 9, and the width 29 of the conductor pattern is wider than the bonding width of the structure 1a. Therefore, it is possible, with a bonding material 31 which bonds the structure 1a and the wiring substrate 27, to sufficiently cover the periphery of the structure 1a (refer to reference symbol 31 in FIG. 27), and it is possible to realize a package with a higher level of reliability.

Furthermore, although it is not shown in FIG. 25 to FIG. 27, it is preferable that Au is formed on the surface of the conductor pattern 26 formed on the wiring substrate 27 and on the surface of an external terminal 28, or on either one of these surfaces.

In an airtightly encapsulating package or in a vacuum encapsulating package, it is necessary to avoid occurring of outgass after the inside of the package has been encapsulated, thereby causing a reduction in the long-term reliability of the electronic device, or a reduction in the level of vacuum in the vacuum encapsulating package. Therefore, the preferred process for bonding the structure 1a and the structure 1b, or bonding the structure 1a and the wiring substrate 27, is a process which does not use flux. In the process which does not use flux, oxidization of the bonding section surface obstructs airtight bonding. Therefore, in order to prevent this type of oxidization, it is preferable that Au is preliminarily formed on at least either one of the surface of the conductor pattern 26 and the surface of the external terminal 28.

That is to say, according to this configuration, it is possible to prevent oxidization of the surface of the conductor pattern 26 and the external terminal 28, and it is also possible to realize superior solder wettability. Moreover, there is a merit in that wire bonding can be conducted using a wire line composed of a metallic material such as Au and Al serving as the primary material thereof, and it is possible to realize a package which has high manufacturing yield and offers a high level of freedom in designing.

(Exemplary Embodiment 6)

Next, a sixth exemplary embodiment of the present invention is described.

Figure 28:
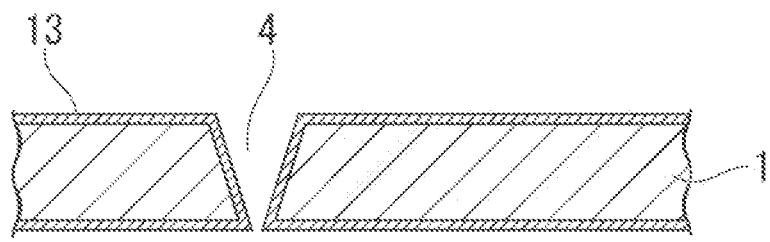
FIG. 28 is a cross-sectional view showing the shape of the through hole in the fifth exemplary embodiment of the present invention.

FIG. 28 shows the sixth exemplary embodiment of the present invention.

In FIG. 28, the same reference symbols are given to portions the same as constituents described in FIG. 1 to FIG. 27, and descriptions thereof are omitted.

The basic configuration of this embodiment is the same as that of the first exemplary embodiment described above, and points of difference therebetween are mainly described here.

A through hole 4 in the present embodiment is formed in a tapered shape in which the diameter of the hole gradually becomes smaller with approach from the topmost surface of one surface of the structure 1 to the surface of the opposite side. With the through hole 4 formed in a tapered shape, in which the diameter thereof gradually becomes smaller with approach from the topmost surface of one surface of the structure 1 to the surface of the opposite side, as described above, it is possible to irradiate a laser beam directly not only on the topmost surface of the one surface of the structure 1 (the location where the hole diameter is the largest) but also on the surface of the inside of the through hole 4. Therefore, the material inside the through hole 4 is also heated and can be melted. As a result, the through hole 4 can be more easily blocked, and it is possible to realize a package with high manufacturing yield.

One of the methods for forming the through hole 4 having this type of tapered shape is an etching method. In particular, if anisotropic etching is used, it is possible to form the shape of the through hole 4 having various types of tapered shapes.

Furthermore, the shape of the through hole 4 may be appropriately changed.

Figure 29:
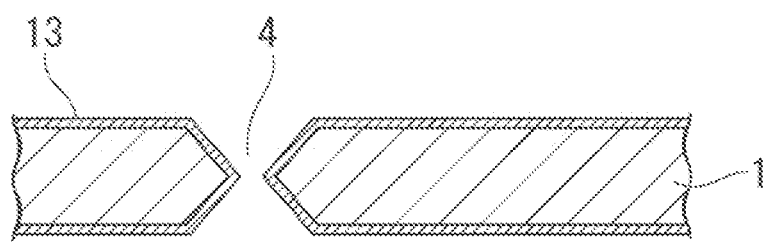
FIG. 29 is a cross-sectional view showing a modified example of FIG. 28.

For example, as shown in FIG. 29, the through hole 4 may be formed in a tapered shape in which the diameter of the hole gradually becomes smaller with approach from the topmost surface of both of the surfaces of the structure 1 to the depthwise center of the hole. If the through hole 4 is formed in this type of shape, there is a merit in that not only an effect similar to that of the through hole 4 of FIG. 28 can be obtained, but also, even if the thickness of the structure 1 having the through hole 4 formed therein becomes thicker, the through hole 4 can be easily formed eventually (if the thickness becomes thicker, the through hole 4 cannot be formed in a tapered shape). That is to say, if the inside of the through hole 4 is of a tapered shape, the diameter gradually becomes smaller with approach in the depth direction of the hole, however, in some cases, the thickness of the structure 1 may need to be made thicker by any means for convenience of the overall design of the package and the manufacturing cost. In this type of case, there may be a case where the through hole 4 cannot be formed eventually, however, this can be remedied as it is formed in the tapered shape in which the diameter of the hole gradually becomes smaller with approach from the topmost surface of both of the surfaces of the structure to the thickness-wise center of the hole.

Figure 30:
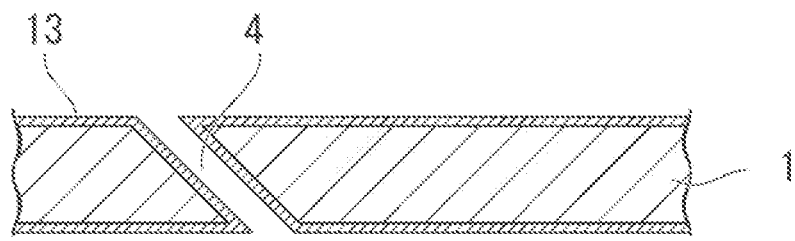
FIG. 30 is a cross-sectional view showing another modified example of FIG. 28.

Furthermore, as shown in FIG. 30, the through hole 4 may be formed diagonally with respect to the thickness direction of the structure 1. If the through hole 4 is formed in this type of shape, it is possible to remedy a defect in which the melted material is released to the outside of the hole due to gravity before it blocks the through hole when the surface of the through hole 4 and the inner surface of the through hole 4 are heated and the material is melted. Therefore, it is possible to realize hole-sealing with higher manufacturing yield. The probability of the above type of defect occurring becomes higher when the through hole is larger.

Moreover, FIG. 28 to FIG. 30 illustrate examples of the metallic layer 13 being formed on the surface of the structure 1. However, the inner shape of these through holes 4 is not limited to this example, and it may of course be applied to a case, for example, where the metallic layer 13 is not formed, or to other embodiments.

(Exemplary Embodiment 7)

Next, a seventh exemplary embodiment of the present invention is described.

FIG. 31 to FIG. 34 show the seventh exemplary embodiment of the present invention.

In FIG. 31 to FIG. 34, the same reference symbols are given to portions the same as constituents described in FIG. 1 to FIG. 30, and descriptions thereof are omitted.

The basic configuration of this embodiment is the same as that of the first exemplary embodiment described above, and points of difference therebetween are mainly described here.

Figure 33:
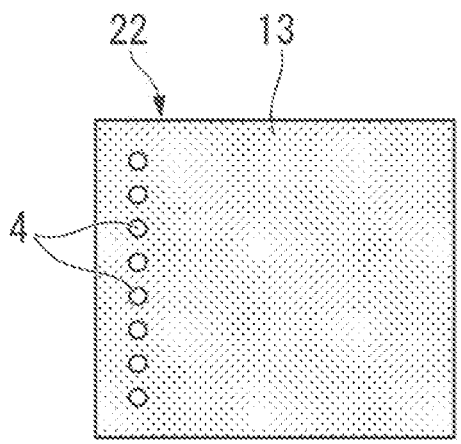
FIG. 33 is a plan view showing a flat plate of FIG. 31.
Figure 34:
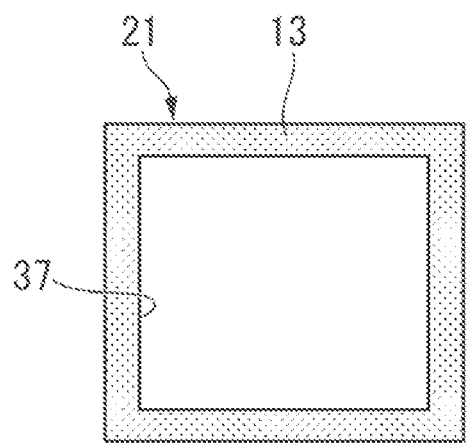
FIG. 34 is a plan view showing a ring-shaped material of FIG. 31.

An encapsulating package of the present embodiment is such that a structure 1a which surrounds all four sides of an electronic device 9 is manufactured in a manner in which a ring-shaped (cylindrical section) material 21 (shown in FIG. 34) which has a cylinder hole formed in the center thereof and which has a size and thickness capable of housing the electronic device 9 inside a cylinder hole 37, is bonded with a rectangular plate-shaped flat plate (plate-shaped section) 22 (shown in FIG. 33).

Here, the square-ring-shaped material 21 and the flat plate 22 are bonded by a metallic layer 13 which is preliminarily formed on each surface thereof, and which has a melting point lower than that of the material constituting each of the structures.

In general, it is difficult to manufacture a structure 1 which has a space (groove) 23 capable of housing the electronic device 9. For example, there is a method for forming, by means of etching, a space portion capable of housing the electronic device 9. However, it is difficult to form the shape of the space with dimensional accuracy. In contrast, according to the encapsulating package of the present embodiment, the ring-shaped material 21, which has the cylinder hole 37 formed in the center thereof and which has the size and thickness capable of housing the electronic device 9 inside the cylinder hole 37, is bonded with the flat plate 22, to thereby manufacture the structure. Therefore, it is possible to easily realize the structure 1 having the space (groove) 23 capable of housing the electronic device 9, and it can be manufactured at low cost.

Figure 31:
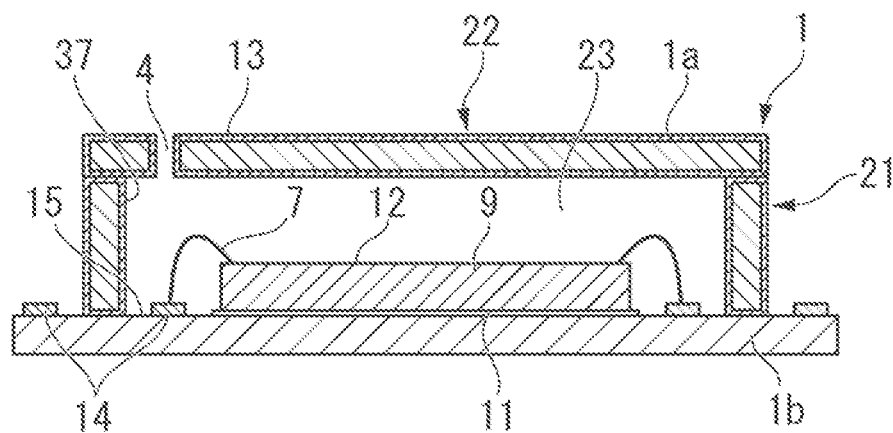
FIG. 31 is a diagram showing an encapsulating package in a seventh exemplary embodiment of the present invention, and is a cross-sectional view showing a state prior to blocking a through hole.
Figure 32:
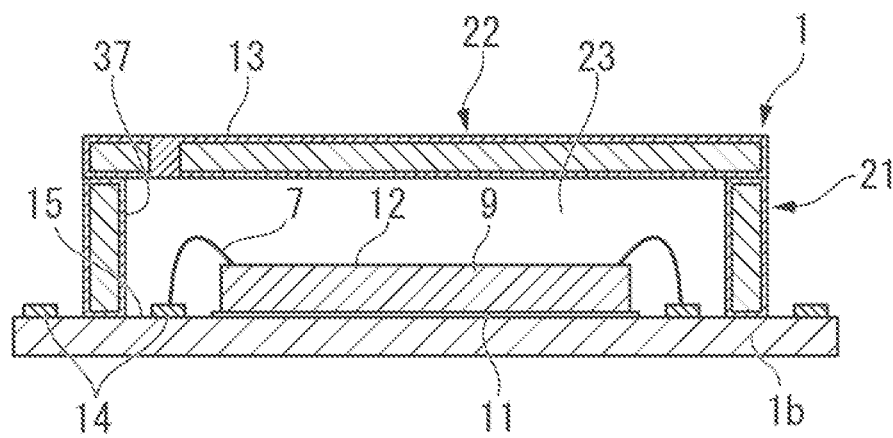
FIG. 32 is a cross-sectional view showing a state where the through hole of FIG. 31 is blocked.

FIG. 31 and FIG. 32 illustrate the example of the metal layer 13 formed on the surface of the structure 1. However, this may of course be applied to a case where this metallic layer 13 is absent (for example, the example shown in the first exemplary embodiment) or to a case of an example described in another embodiment.

In a case where the metallic layer 13 is absent on the surface in the first place, for example, a fixing material such as solder is subsequently formed on the surface of the square-ring-shaped material 21 and flat plate 22, and they are fused together. Alternatively, if they are of the same material, they are bonded using a bonding method such as surface activated bonding, thermal compression bonding, ultrasonic bonding, anodic bonding, and the like.

(Exemplary Embodiment 8)

Next, an eighth exemplary embodiment of the present invention is described.

FIG. 35 to FIG. 39 show the eighth exemplary embodiment of the present invention.

In FIG. 35 to FIG. 39, the same reference symbols are given to portions the same as constituents described in FIG. 1 to FIG. 34, and descriptions thereof are omitted.

The basic configuration of this embodiment is the same as that of the first exemplary embodiment described above, and points of difference therebetween are mainly described here.

An electronic device 9 of the present embodiment includes an infrared ray sensor (infrared ray receiving element) 24.

There are two types of the infrared ray sensor 24, namely "quantum type" and "thermal type".

The "thermal type" has a simpler structure and the manufacturing cost is lower, and therefore use of a thermal type infrared ray sensor 24 is preferred from the point of manufacturing cost. In order to increase the sensitivity of a thermal type infrared ray sensor, it is necessary to increase the level of thermal insulation in order not to release, as much as possible, the heat occurring in an infrared ray detecting section to the outside, to enlarge temperature changes in the infrared ray detecting section, when an infrared ray is irradiated on the infrared ray sensor 24. Consequently, in order for the thermal type infrared ray sensor (infrared ray receiving device) to perform with minimum performance, in general, a vacuum state of $10^{-2}$ Torr or lower is required as a surrounding environment. That is to say, it requires a vacuum environment where there are almost no gas molecules inside the package, rather than an ordinary airtightly encapsulating package. Moreover, in order to maintain the stability of the device for a prolonged period of time, it is preferable to further increase the level of vacuum immediately after vacuum encapsulating. Further, it is preferable that having vacuumed the inside of the package to $10^{-6}$ Torr or lower, the through hole 4 is sealed in a highly airtight state. It is vacuum encapsulated, but nevertheless it is highly unlikely that the level of vacuum of the inside will not be reduced at all after encapsulating, and it always has a leak rate of a finite value. When the level of vacuum is higher immediately after vacuum encapsulating, even at the same leak rate, it takes a longer time until the level of vacuum has become deteriorated to $10^{-2}$ Torr at which minimum performance can be still exerted, and an infrared ray receiving device package with a high level of long-term reliability can be realized eventually.

In the encapsulating package in the present embodiment, in a portion of the structure 1a positioned directly above (a portion opposed to) a light receiving section of the infrared ray receiving element 24, there is provided a rectangular infrared ray transmitting hole 35, and an infrared ray transmitting window material (material which can transmit infrared rays) 25 is bonded thereon so as to block the infrared ray transmitting hole 35.

The infrared ray receiving element 24 is mounted inside the vacuum-encapsulated package. Since infrared rays need to be transmitted from the outside of the package into the package, as the infrared ray transmitting window material 25, in addition to Si, Ge, ZnS, ZnSe, $Al_2O_3$, and $SiO_2$, materials including an alkali halide based material or alkaline-earth halide based material such as LiF, NaCl, KBr, CsI, $CaF_2$, $BaF_2$, and $MgF_2$, and a chalcogenide based glass having Ge, As, Se, Te, Sb, or the like serving as the primary component thereof, are preferable.

According to this configuration, the infrared ray receiving element 24 is encapsulated within a vacuum atmosphere, and the infrared ray transmitting window material 25 is mounted on the portion positioned directly above the light receiving section of the infrared ray receiving element 24. Consequently, an infrared ray travels through the infrared ray transmitting window material 25 from the outside of the encapsulating package, and it reaches the infrared ray receiving section. Therefore, it is possible to realize an infrared ray sensor package with a high level of sensitivity.

Moreover, the flat plate 22 is bonded with the ring-shaped material 21 which has the cylinder hole 37 formed in the center thereof and which has a size and thickness capable of housing the electronic device 9 inside the cylinder hole 37, thereby creating a space for housing the electronic device 9 (infrared ray sensor 24). Here, the flat plate 22 and the ring-shaped material 21 are bonded to thereby form a space for housing the infrared ray sensor 24. However, it is not limited to this structure, and a groove may be provided in a single material, using a mold, to thereby manufacture a space for housing the infrared ray sensor 24.

Furthermore, although not shown in FIG. 35 to FIG. 39, an anti-reflection film is preliminarily formed on the surface of the infrared ray transmitting window material 25.

Moreover, in order to achieve a high level of vacuum inside the package, a so-called getter material (omitted in the diagram) composed of a Zr based material, Ti based material, or an alloy which contains these materials, may be formed or mounted inside the package. The getter material is activated after the package has been vacuum encapsulated, and it thereby serves to adsorb outgas inside the package. Therefore, by using the getter material, it is possible to maintain the inside of the package in a high vacuum.

Moreover, here, a description has been made with an example of a case where the thermal type infrared ray sensor (infrared ray detecting element) 24 is used as the electronic device 9. However, it is not limited to the infrared ray sensor (infrared ray detecting element) 24, and may be applied to other types of sensor element (such as a quantum type infrared ray sensor, a pressure sensor, an acceleration sensor, a hydraulic sensor, and a gyro sensor), a memory, a logic LSI, a power supply IC, and the like. In this case, the level of vacuum inside the package may be lower than $10^{-2}$ Torr.

Furthermore, while Torr is used as the pressure unit in the present specification, it may be converted into SI units at 1 Torr=133.3 Pa.

(Exemplary Embodiment 9)

Figure 49:
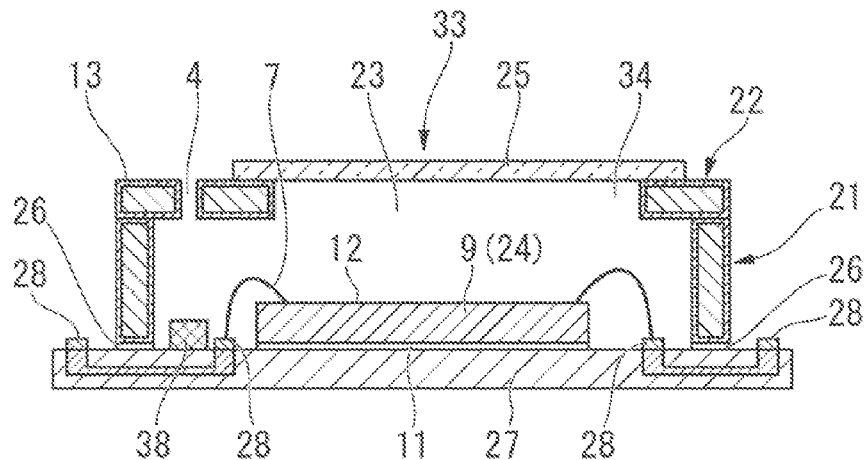
FIG. 49 is a diagram showing an encapsulating package in a ninth exemplary embodiment of the present invention, and is a cross-sectional view showing a state prior to blocking a through hole.
Figure 50:
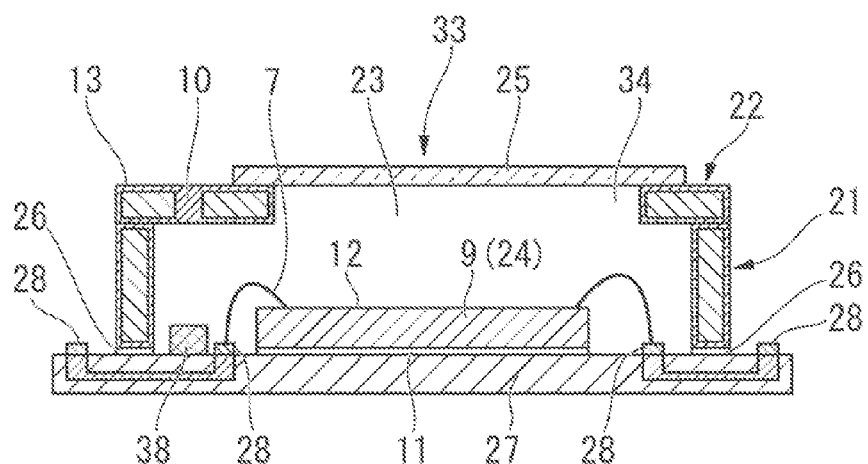
FIG. 50 is a cross-sectional view showing a state where the through hole of FIG. 49 is blocked.

Next, a ninth exemplary embodiment of the present invention is described. FIG. 50 shows the ninth exemplary embodiment of the present invention. FIG. 49 shows a state prior to blocking a through hole 4.

Moreover, in FIG. 49 to FIG. 56, the same reference symbols are given to portions the same as constituents described in FIG. 1 to FIG. 39, and descriptions thereof are omitted.

The basic configuration of this embodiment is the same as that of the eighth exemplary embodiment described above, and points of difference therebetween are mainly described here. The present embodiment has a structural characteristic differing from other embodiments in which inside a package main body section 33, at a position which can be in contact with a laser beam irradiated through the through hole 4, there is mounted a getter material 38 capable of adsorbing gas molecules. The getter material 38 adsorbs outgas which occurs from the inner surface of the package main body section 33 due to temporal changes after vacuum encapsulating, and it functions to suppress deterioration in the level of vacuum inside the package main body section 33 even when outgas occurs. As the getter material 38, although there are no particular limitations, for example, use of a Zr based material, a Ti based material, or an alloy material containing any one of these materials, is preferred. Moreover, it is preferable that the getter material 38 is mounted or formed directly under the through hole 4 on the wiring substrate 27 or at a position where it can be in contact with a laser beam traveling through the through hole 4. There are no particular limitations on the mounting method or formation method of the getter material 38. However, for example, it is mounted or formed by a method of welding it on the wiring substrate 27, or film-forming it directly on the wiring substrate by means of a thin film formation technique such as a vacuum sputtering method and a vacuum vapor deposition method.

Figure 51:
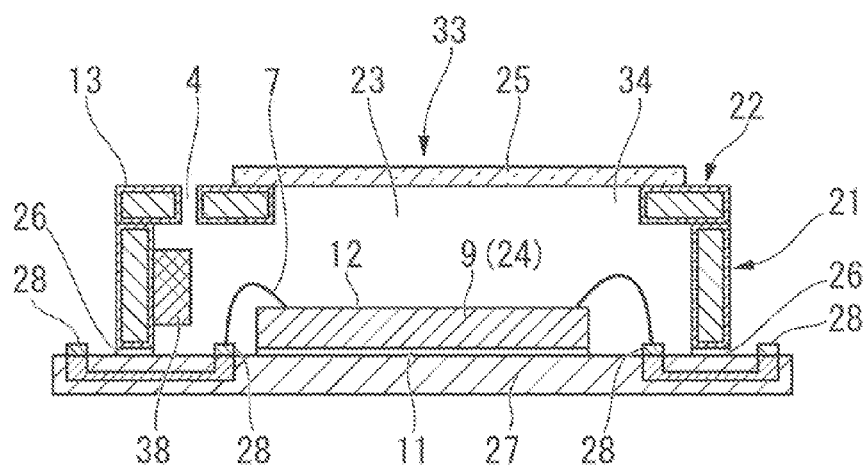
FIG. 51 is a cross-sectional view showing a modified example of the ninth exemplary embodiment of the present invention.
Figure 52:
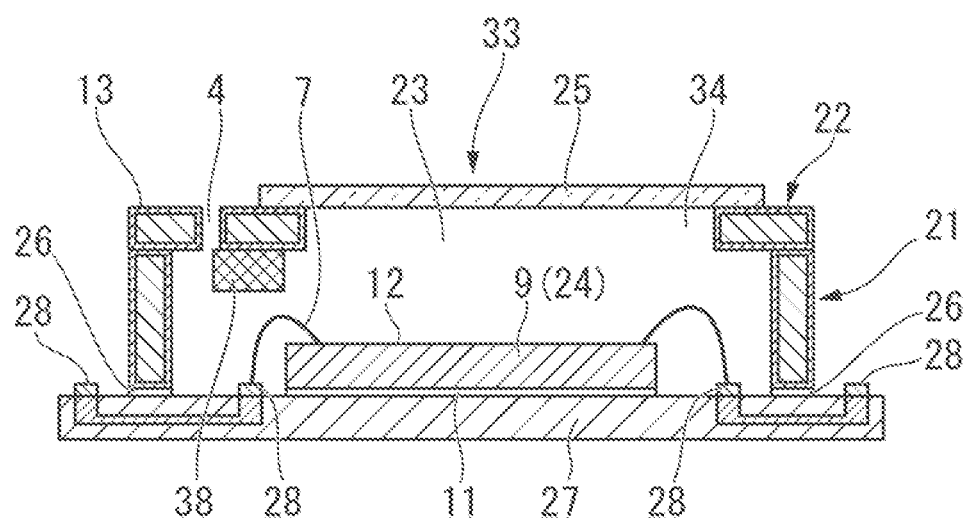
FIG. 52 is a cross-sectional view showing a modified example of the ninth exemplary embodiment of the present invention.

Furthermore, the getter material 38 may be mounted or formed on a ring-shaped material 21 as illustrated in FIG. 51 in a modified example of the present embodiment (prior to blocking the through hole 4), in a method similar to the above method. Alternatively, it may be mounted or formed on the surface of the flat plate 22 in the vicinity of the through hole 4 as illustrated in FIG. 52 in a modified example of the present embodiment (prior to blocking the through hole 4). As long as at least one portion of the getter material 38 can be brought into contact with a laser beam traveling through the through hole 4, the getter material 38 can be heated and activated (the molecules adsorbed on the surface can be released, and it can be brought to a state of being capable of adsorbing molecules again).

Moreover, here, there is shown an example of manufacturing a structure (second main body section) 1a which surrounds all four sides of the electronic device 9 by bonding the ring-shaped material 21 with the flat plate 22. However, it is not particularly limited to this, and the structure (second main body section) 1a may of course be of an integrated body.

Figure 53:
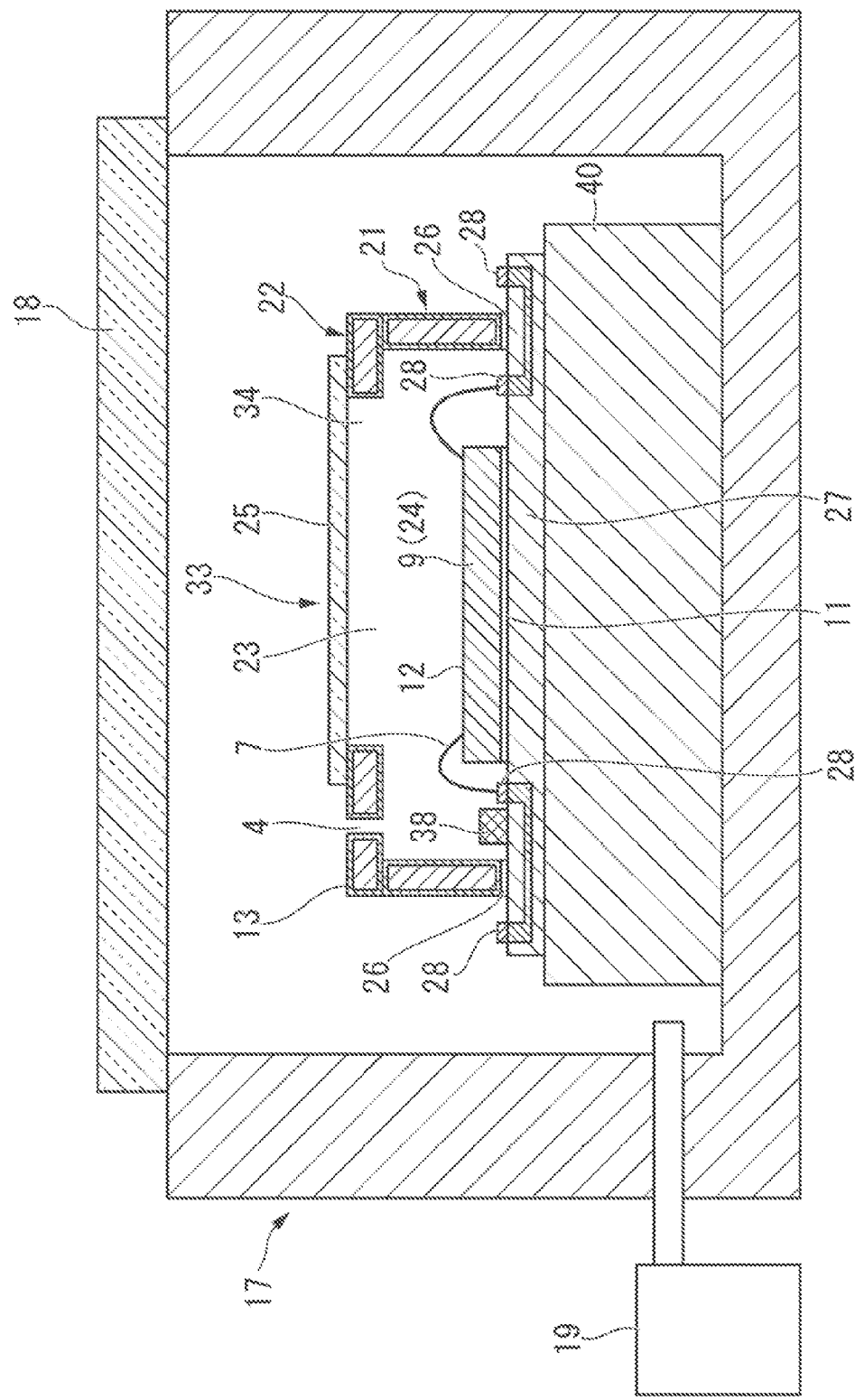
FIG. 53 is a cross-sectional view showing a state where the ninth exemplary embodiment of the present invention shown in FIG. 49 (prior to blocking the through hole) is installed inside a vacuum chamber.
Figure 54:
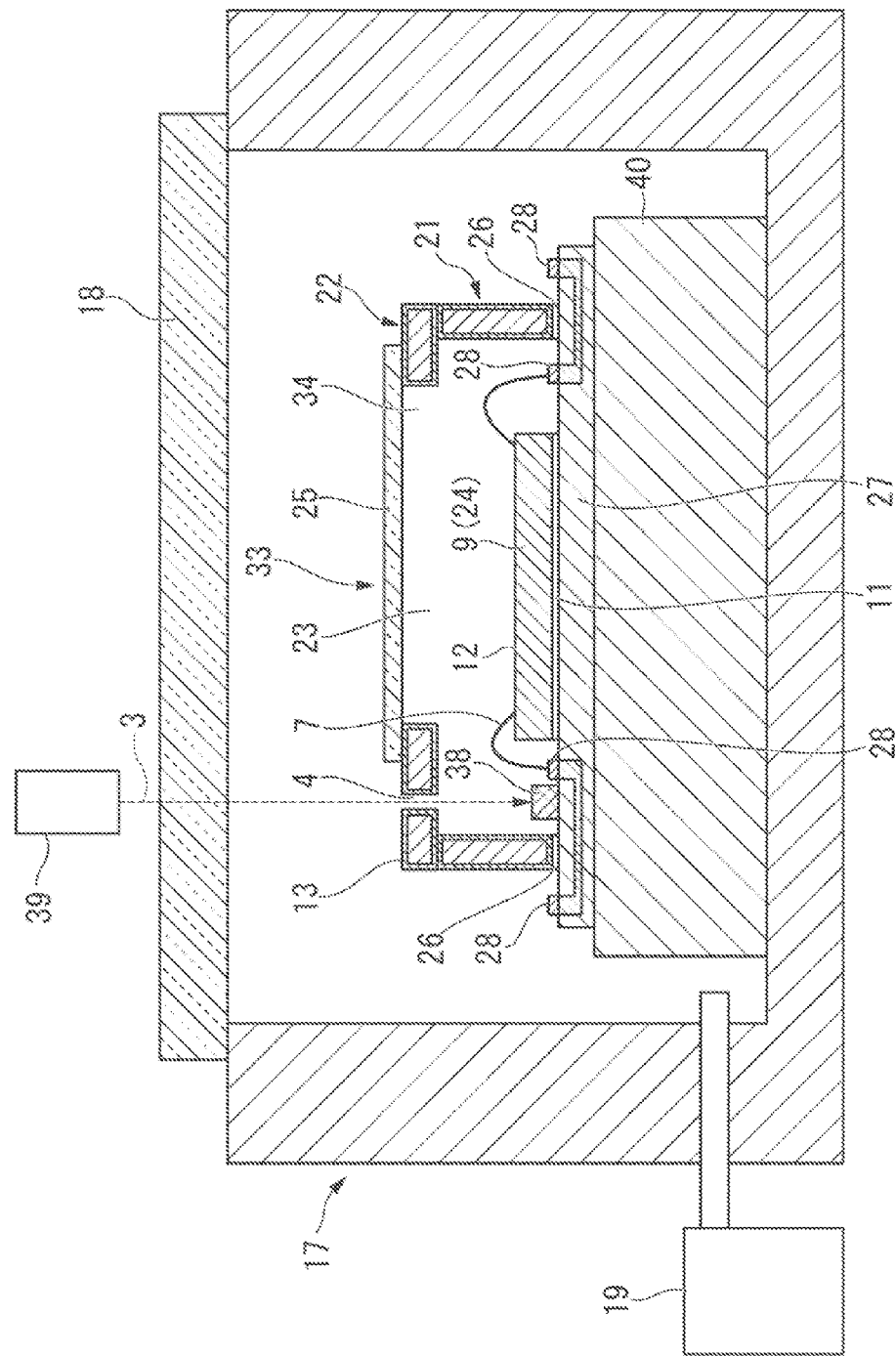
FIG. 54 is a cross-sectional view showing a state where a getter material of FIG. 53 is being heated by a laser beam transmitted through the through hole.
Figure 55:
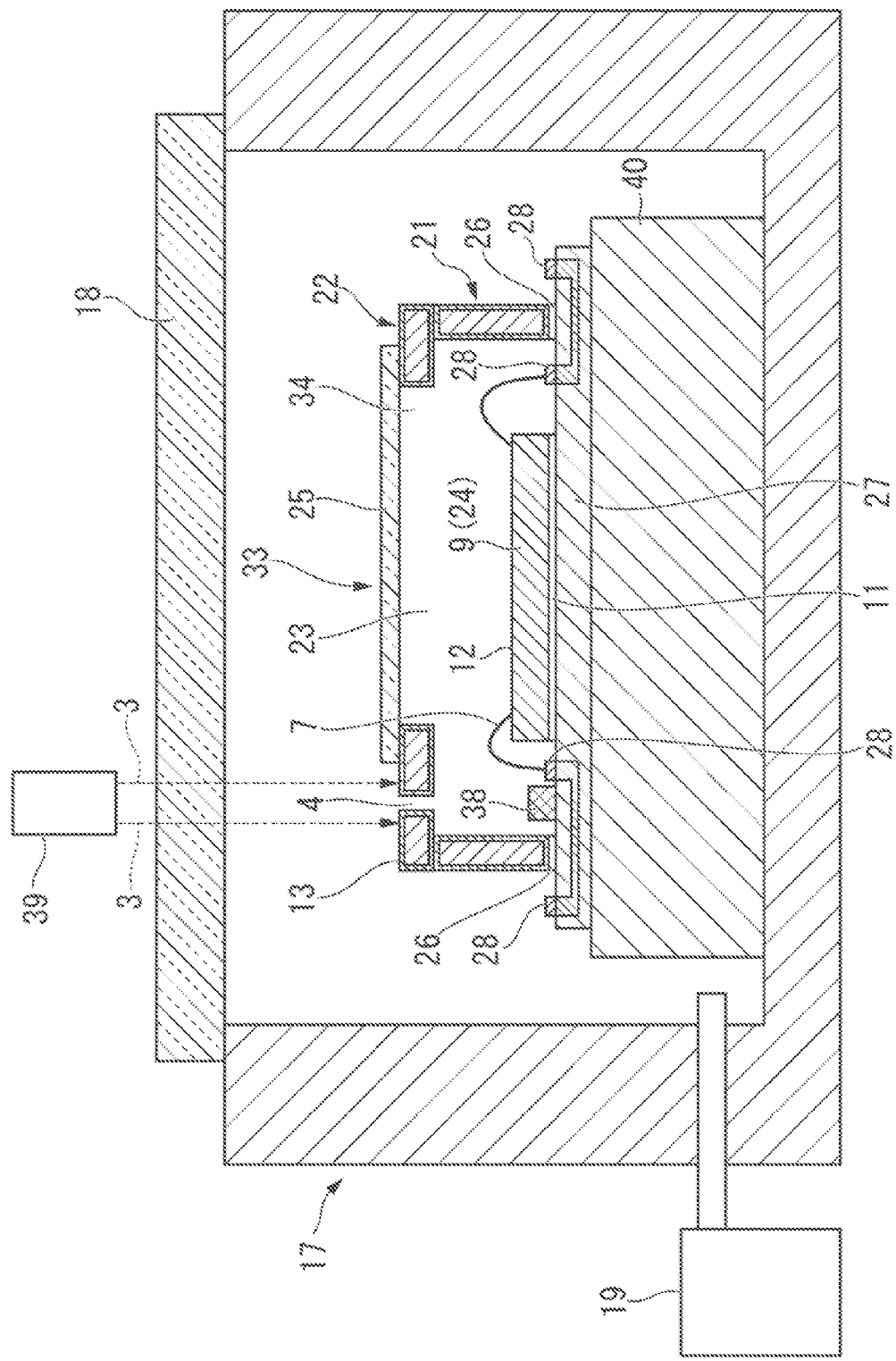
FIG. 55 is a cross-sectional view showing a state where, after the step of FIG. 54, a laser beam is being irradiated to the periphery of the through hole.
Figure 56:
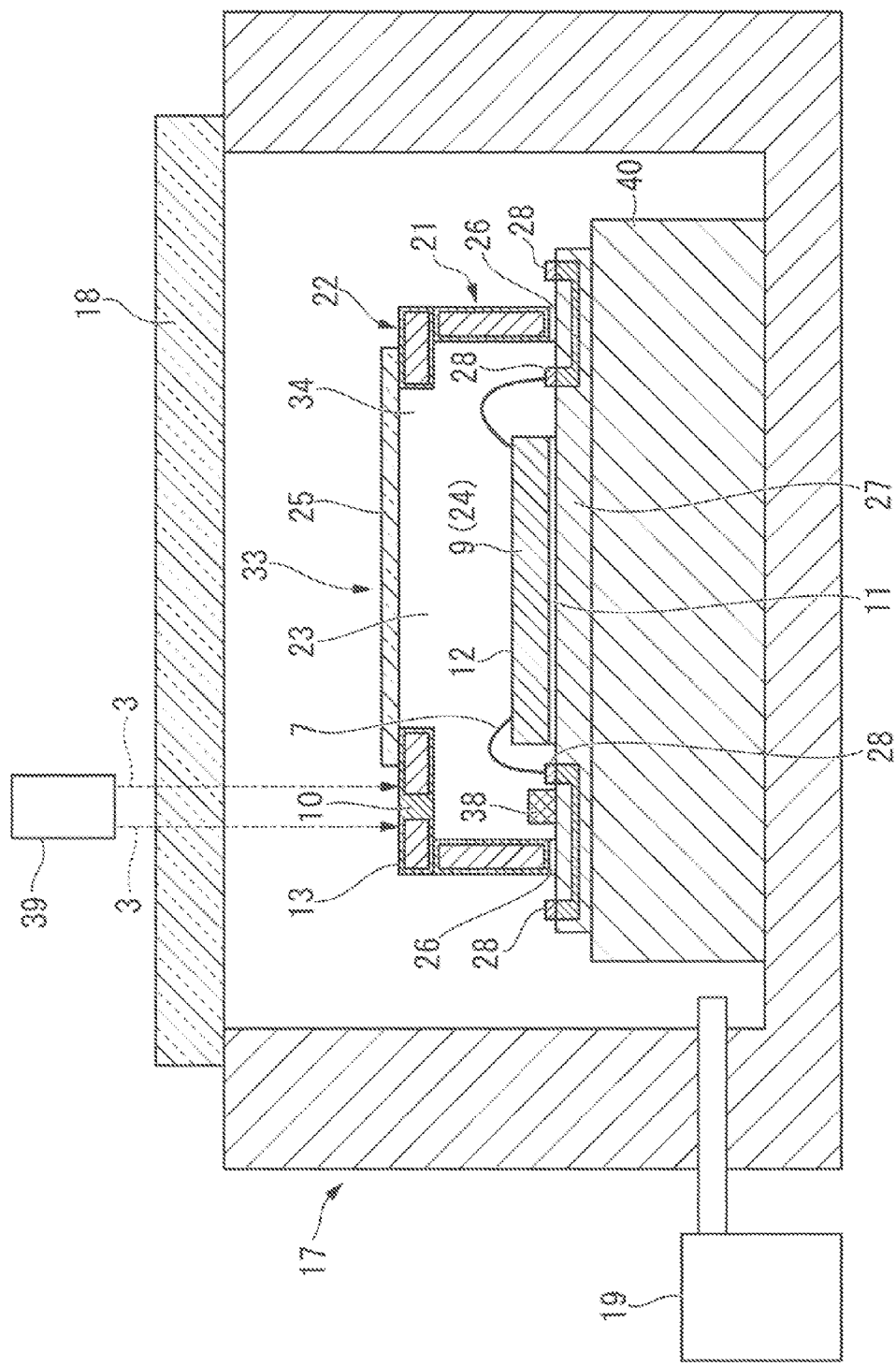
FIG. 56 is a cross-sectional view showing a state where the through hole has been blocked after the step of FIG. 55.

Next, a manufacturing method of the present embodiment is described. As a representative example, there is described a case of using an encapsulating package (prior to blocking the through hole 4) of the exemplary embodiment shown in FIG. 49. As shown in FIG. 53, first, the encapsulating package (prior to blocking the through hole 4) is placed on a stage 40 inside a vacuum chamber 17, and then the inside of the encapsulating package is vacuumed through the through hole 4. Furthermore, while conducting vacuuming, a heater preliminarily installed in the stage (omitted in the diagram) and a heater wound on the surface of the vacuum chamber 17 (omitted in the diagram) are heated, to thereby heat the inside of the vacuum chamber 17 and the inside of the encapsulating package to approximately 150° C. The purpose of this step is to convert the water content, which is adsorbed inside the vacuum chamber 17 and inside the encapsulating package, into water vapor, and vacuum the water vapor, and it is conducted for approximately two hours for example although there are not particular time restrictions. Then, as the ultimate vacuum inside the vacuum chamber 17, it is confirmed that the level of vacuum therein has achieved a vacuum level or lower at which a predetermined performance of the electronic device 9 can be obtained ($10^{-6}$ Torr is generally preferred in the case where the electronic device 9 is an infrared ray sensor 24). Subsequently, a laser beam 3 is caused to travel through the through hole 4 and irradiate on the getter material 38 as shown in FIG. 54. The irradiation time of the laser beam 3 is appropriately set according to the temperature of heat application to the getter material 38, and, for example, if the heat application temperature is 400° C., irradiation is conducted for approximately 5 to 10 minutes. Moreover, in the case where the heat application temperature is raised to approximately 900° C., the irradiation time can be reduced to approximately one minute or less. Next, the laser beam 3 is irradiated on the periphery of the through hole 4, and the metallic layer 13, the melting point of which is lower than that of the constituent material of the structure, is melted, thereby blocking the through hole 4 (FIG. 56). Alternatively, although the illustration differs from FIG. 55, the metallic material which constitutes the structure is melted to thereby block the through hole 4, thus completing the vacuum encapsulating package of the exemplary embodiment of the present invention shown in FIG. 50.

Here, there are no particular restrictions on the method for irradiating the laser beam 3 on the periphery of the through hole 4. However, it is preferable that the irradiation diameter of the laser beam 3 is set larger than the diameter of the through hole 4, and irradiation is conducted while the through hole 4 is positioned within the irradiation region of the laser beam 3. Alternatively, use of a method of irradiating the laser beam 3 so as to draw a circle centered on the through hole 4, is preferred.

(Exemplary Embodiment 10)

Next, a tenth exemplary embodiment of the present invention is described.

Figure 40:
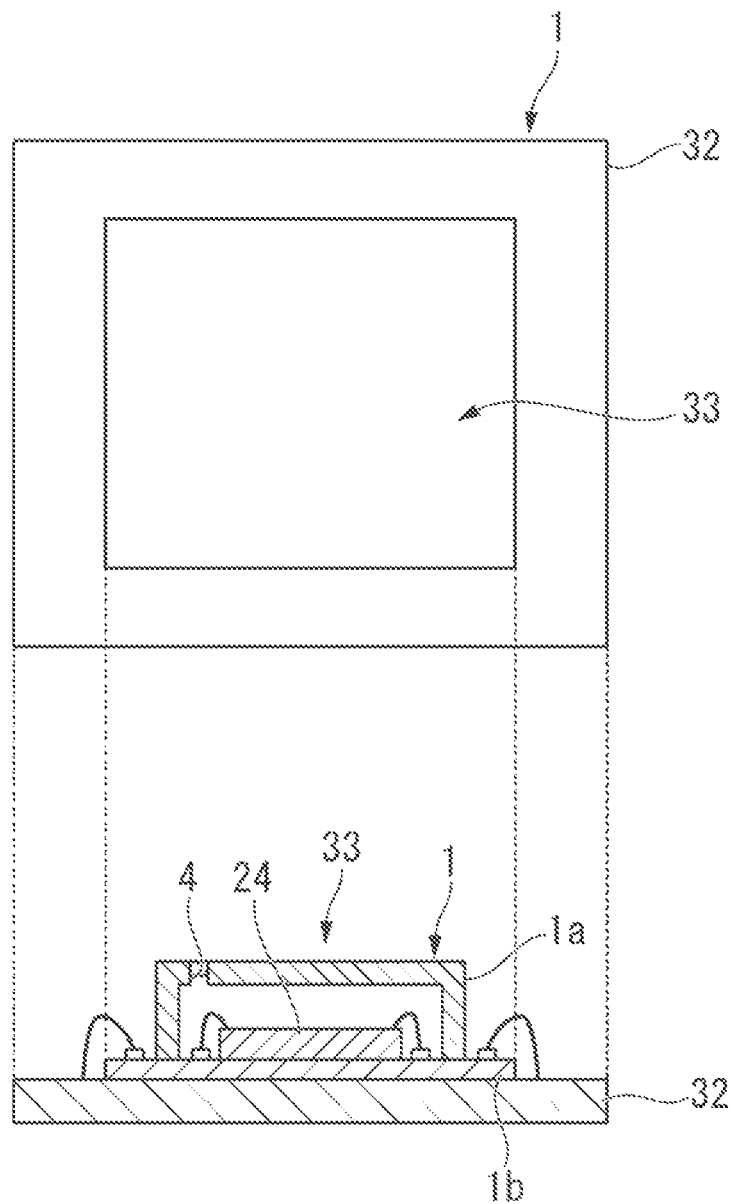
FIG. 40 is an explanatory diagram showing a printed circuit board in a tenth exemplary embodiment of the present invention.

FIG. 40 shows the tenth exemplary embodiment of the present invention.

In FIG. 40, the same reference symbols are given to portions the same as constituents described in FIG. 1 to FIG. 39, and descriptions thereof are omitted.

The basic configuration of this embodiment is the same as that of the first exemplary embodiment described above, and points of difference therebetween are mainly described here.

The present embodiment is configured as a printed circuit board 32 with an encapsulating package 33 mounted thereon.

That is to say, the printed circuit board 32 includes the encapsulating package 33 which uses an infrared ray sensor (infrared ray detecting element) 24 as an electronic device 9.

As the encapsulating package 33, the encapsulating package in the first to eighth exemplary embodiments may of course be applied.

Figure 41:
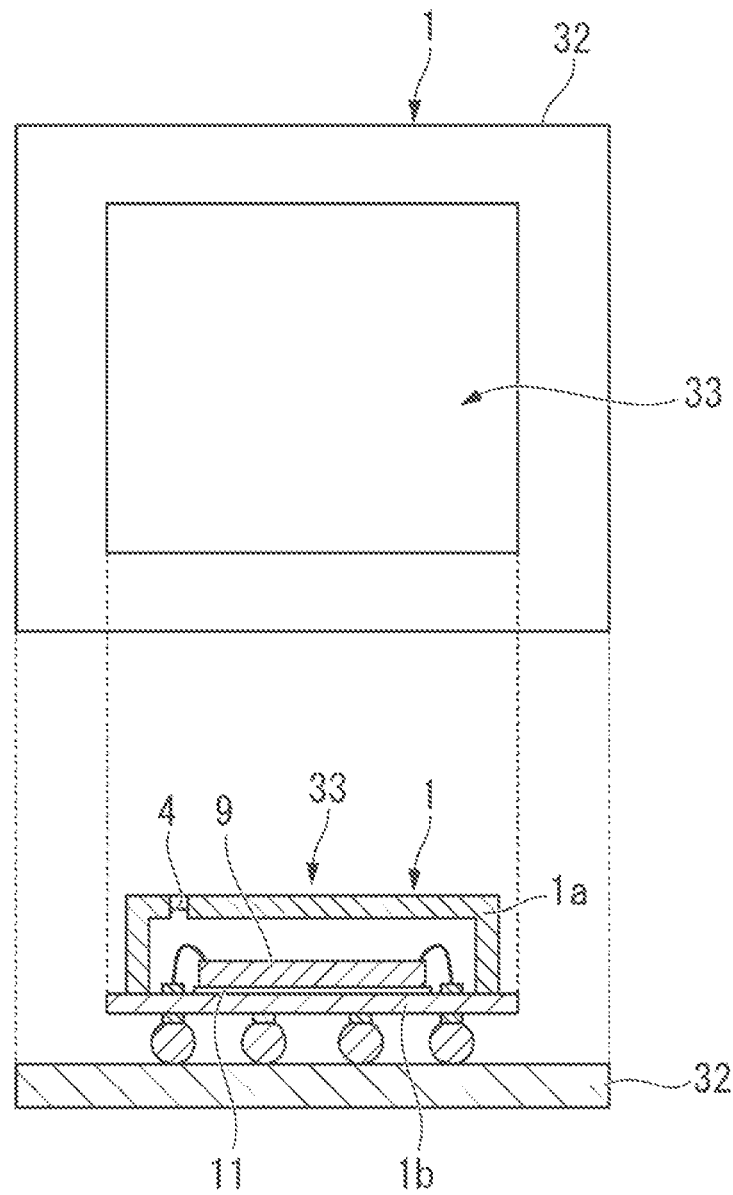
FIG. 41 is an explanatory diagram showing a modified example of FIG. 40.

Moreover, the printed circuit board 32 may be equipped with, as the electronic device 9, an encapsulating package which uses a device other than the infrared ray sensor (infrared ray receiving element) as shown in FIG. 41.

In any of these cases, by mounting these encapsulating packages, it is possible to manufacture the low cost printed circuit board 32 which offers a higher level of freedom in structure designing.

(Exemplary Embodiment 11)

Next, an eleventh exemplary embodiment of the present invention is described.

Description of the diagram is omitted here, however, it is possible to assemble an electronic device using the encapsulating package in the first to ninth exemplary embodiments, or the printed circuit board 32 in the tenth exemplary embodiment.

That is to say, the present embodiment is configured as an electronic device including the above encapsulating package or the printed circuit board 32.

According to this electronic device, manufacturing cost can be lowered compared to that of the conventional practice.

Examples of electronic devices to which this may be applied include, for example, an infrared camera, on which a vacuum encapsulating package of the infrared ray sensor (infrared ray receiving element) 24, or a module substrate having the package mounted thereon (printed circuit board) is mounted, and a thermography capable of visualizing a temperature distribution of an object. Moreover, even when the electronic device 9 is a device other than the infrared ray sensor 24, for example, it is still suitable for on-vehicle electronic devices (car navigation, car audio, ETC device, and the like), with which malfunction is not acceptable even under an environment of high temperature and humidity, and for electronic devices for underwater use (underwater camera, underwater sonar device, and the like) which do not tolerate water ingress.

Several exemplary embodiments have been described, however, needless to say, the present invention should not be considered as being limited to the above embodiments unless it departs from the scope of the invention.

Hereunder, the present invention is further described in detail based on a working example of the present invention. However, the present invention should not be considered as being limited to the following working example unless it departs from the scope of the invention.

Working Example 1

As a working example of the present invention, there is described a vacuum encapsulating package which uses an infrared ray sensor (infrared ray receiving device).

The present working example is described in detail, with reference to FIG. 35 to FIG. 39.

First, an Si substrate (FIG. 13*d*) of a size 10 mm×13 mm and thickness 0.8 mm was prepared as an infrared ray transmitting window material 25. An anti-reflection film was preliminarily formed on the Si substrate. Moreover, Ni (3 μm)/Au (0.05 μm) was formed in an area inner side by 1 mm width from the outermost periphery of the Si substrate, by means of a nonelectrolytic plating method. The reason for this was to easily perform bonding do a SnAg film formed on the surface of a structure 1 (flat plate 22) to be bonded later, while providing superior wettability without use of flux.

Figure 37:
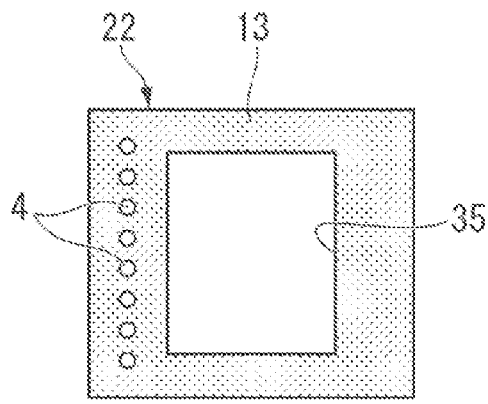
FIG. 37 is a plan view showing a flat plate of FIG. 35.
Figure 38:
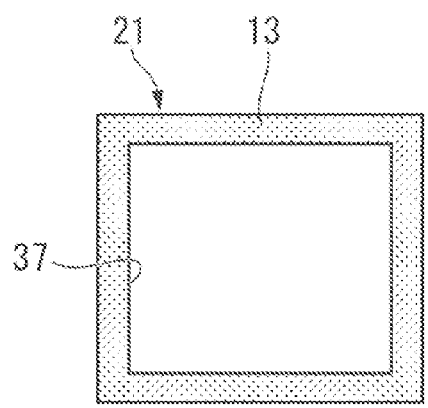
FIG. 38 is a plan view showing a ring-shaped material of FIG. 35.
Figure 39:
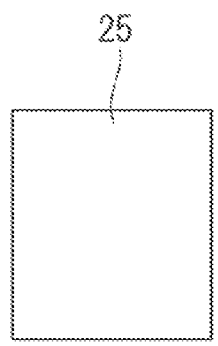
FIG. 39 is a plan view showing an infrared ray transmitting window material of FIG. 35.

Next, there were prepared a flat plate 22 with outer diameter 15 mm×15 mm, inner diameter 8 mm×11 mm (diameter of the through hole of a cylinder hole 37), and thickness 0.22 mm shown in FIG. 37, and a ring-shaped material 21 with outer diameter 15 mm×15 mm, inner diameter 13 mm×13 mm, and thickness 1.5 mm shown in FIG. 38 which has a cylinder hole 37 formed in the center thereof, and which has a size and thickness capable of housing the electronic device 9 inside the cylinder hole 37.

The materials shown in FIG. 37 and FIG. 38 were manufactured using 42 alloy (alloy of Ni and Fe). Micro through holes 4 shown in FIG. 37 were formed as through holes with maximum diameter 0.2 mm, by means of chemical etching with use of a mask. There were formed four through holes (although FIG. 37 illustrates this as though eight holes were formed). The shape of the inside of the through hole 4 was formed in a slightly tapered shape by means of an etching method, and the minimum diameter of the through hole 4 was 0.17 mm. Moreover, a 50 μm SnAg (3.5%) film was formed on the surface of these materials and inside the through hole 4 by means of an electrolytic method. As a result, the opening diameter of the micro through hole 4 was 0.07 mm to 0.1 mm.

Figure 35:
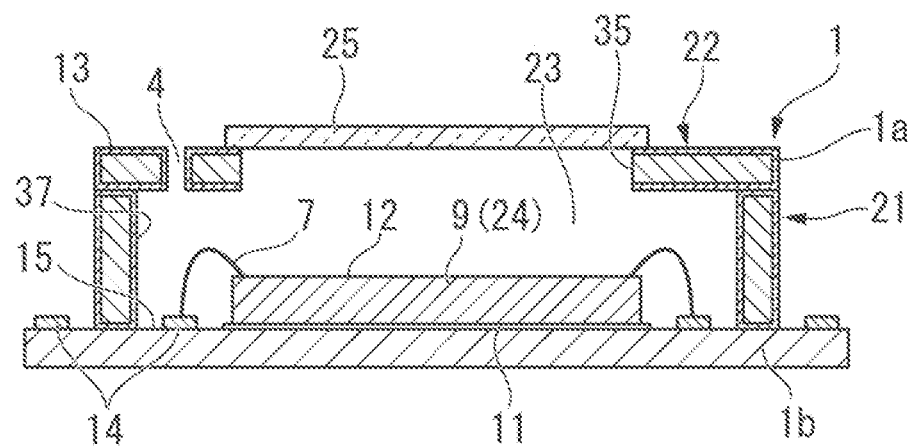
FIG. 35 is a diagram showing an encapsulating package in an eighth exemplary embodiment of the present invention, and is a cross-sectional view showing a state prior to blocking a through hole.
Figure 36:
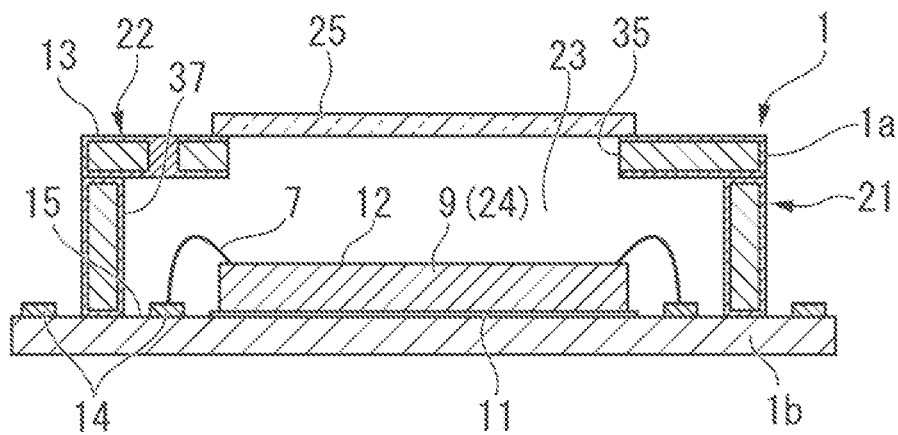
FIG. 36 is a cross-sectional view showing a state where the through hole of FIG. 35 is blocked.

A circuit board with outer diameter 18 mm×18 mm and thickness 0.5 mm, and the base material of which was glass ceramics, was used as a structure 1*b* shown in FIG. 35. Ni·(3 μm)/Au (0.05 μm) was preliminarily formed on the surface of a conductor pattern on the circuit board, by means of a non-electrolytic plating method. Furthermore, the width of the conductor pattern on the circuit board to be bonded with the ring-shaped material 21 was 1.2 mm, and was designed larger than the bonding width 1.0 mm (in reality, the thickness of a Sn—Ag plating is added thereto, making it 1.1 mm) of the ring-shaped material 21.

Next, the electronic device 9 (infrared ray sensor 24 in the present working example) was adhesively fixed on the circuit board (structure 1*b*) by a bonding material, and then, the infrared ray sensor and an external terminal 14 of the circuit board were bonded with a wire which uses an Al line.

Subsequently, the conductor pattern on the circuit board (structure 1*b*), the ring-shaped material 21, the flat plate 22, and the infrared ray transmitting window material 25 were position-aligned and laminated, and they were then collectively bonded using a nitrogen reflow furnace.

Next, the above sample was installed inside the vacuum chamber shown in FIG. 14 (although FIG. 14 illustrates as though the circuit board is not used for the structure 1*b*), the inside of the vacuum chamber was vacuumed using a rotary pump and a turbo-molecular pump, and the inside of the vacuumed package was vacuumed to $10^{-6}$ Torr via the through holes 4. Subsequently, a laser beam 20 was irradiated, from a laser apparatus installed outside the vacuum chamber 17, on the periphery of the package through hole through a glass window 18, to thereby manufacture a package which was encapsulated within a vacuum atmosphere. Further, the spot diameter of the laser beam 20 was 0.4 mm. The preferred dimensions A, B, C, and D have been described as $CB^2/(D^2-B^2) \leq A$, $B<D$, in the case where the thickness of the SnAg film is A (0.05 mm), the diameter of the through hole after the SnAg film has been formed is B (maximum 0.1 mm), the thickness of the structure having the through hole 4 formed therein is C (0.2 mm), and the spot diameter of laser beam is D (0.4 mm). With the dimensions A, B, C, and D in a range defined by the above formulas, it was possible to reliably block the through holes 4 with the SnAg material.

Furthermore, when this vacuum encapsulating package was mounted in an infrared camera, acquisition of a required image was confirmed.

According to the present invention, through holes can be blocked quickly and easily, and manufacturing cost can be reduced as a result.

Moreover, by mounting the encapsulating package of the present invention on a printed circuit board, it is possible to realize a lower cost circuit board with enhanced performance and a high level of reliability.

Furthermore, by mounting the above encapsulating package, or a printed circuit board having this encapsulating package mounted thereon, on an electronic device, it is possible to realize a lower cost electronic device with enhanced performance and a high level of reliability.

The invention claimed is:
1. An encapsulating package comprising:
a package main body section having a hollow section; and
an electronic device provided in the hollow section in the package main body section,
in the package main body section, there being formed a through hole, through which the hollow section communicates with outside of the package main body section, in a vicinity of the through hole, there being provided a low-melting point section having a melting point lower than that of the package main body section, and in the through hole, there being provided a sealing section in which the low-melting point section in the vicinity of the through hole is partly heated and the low-melting point section is melted to thereby block the through hole, wherein the hollow section is vacuumed via the through hole, and the through hole is blocked in a vacuum atmosphere to thereby vacuum encapsulate the electronic device, wherein inside the package main body section, at a position which is contactable with a laser beam irradiated through the through hole, there is mounted a getter material capable of adsorbing gas molecules, wherein the electronic device is an infrared ray receiving element, and in a portion of the package main body section which opposes to a light receiving section of the infrared ray receiving element, there is provided an infrared ray transmitting hole and an infrared ray transmitting window material is bonded so as to block the infrared ray transmitting hole.

2. The encapsulating package according to claim 1, wherein the package main body section is configured such that a first main body section and a second main body section are bonded via the hollow section, the through hole is formed in the second main body section, and the low-melting point section is formed in an entire surface of the second main body section including an inner periphery section of the through hole.

3. The encapsulating package according to claim 1, wherein the low-melting point section is partly heated and melted by a laser beam, a thickness of the low-melting point section is set so that a volume of the low-melting point section to be melted is greater than a volume of the through hole, and a spot diameter of the laser beam is set greater than a diameter of the through hole.

4. The encapsulating package according to claim 1, wherein the low-melting point section is Sn or an alloy material including Sn.

5. An encapsulating package comprising:
a package main body section having a hollow section; and
an electronic device provided in the hollow section in the package main body section, in the package main body section, there being formed a through hole, through which the hollow section communicates with outside of the package main body section, and in the through hole, there being provided a sealing section in which vicinity of the through hole is partly heated and a constituent material of the package main body section is melted to thereby block the through hole, wherein the hollow section is vacuumed via the through hole, and the through hole is blocked in a vacuum atmosphere to thereby vacuum encapsulate the electronic device, wherein inside the package main body section, at a position which is contactable with a laser beam irradiated through the through hole, there is mounted a getter material capable of adsorbing gas molecules, wherein the electronic device is an infrared ray receiving element, and in a portion of the package main body section which opposes to a light receiving section of the infrared ray receiving element, there is provided an infrared ray transmitting hole, and an infrared ray transmitting window material is bonded so as to block the infrared ray transmitting hole.

6. The encapsulating package according to claim 5, wherein the package main body section includes a wiring substrate, and the electronic device is electrically connected to the wiring substrate.

7. The encapsulating package according to claim 6, wherein on a surface of the wiring substrate, there is formed a continuous conductor pattern which surrounds a periphery of the electronic device, and a width of the conductor pattern is wider than a bonding width of a structure to be bonded with the wiring substrate.

8. The encapsulating package according to claim 6, wherein on a same surface of the wiring substrate as a surface having the electronic device provided thereon, and inside and outside of the hollow section, there is provided an external terminal which is electrically connected to the electronic device.

9. The encapsulating package according to claim 6, wherein on a surface of the wiring substrate where the electronic device is provided, and on a surface reverse-opposite of the surface having the electronic device provided thereon, there is formed an external terminal which is electrically connected to the electronic device.

10. The encapsulating package according to claim 6, wherein Au is formed at least on either one of a surface of the conductor pattern formed on the wiring substrate, and a surface of the external terminal.

11. The encapsulating package according to claim 6, wherein the wiring substrate uses a ceramics material or Si for a base material thereof 12. The encapsulating package according to claim 6, wherein the package main body section excluding the wiring substrate includes an alloy material including at least Ni.

13. The encapsulating package according to claim 5, wherein the package main body section includes a semiconductor material, a metallic material such as Ni, Fe, Co, Cr, Ti, Au, Ag, Cu, Al, Pd, and Pt, an alloy material having these as a primary component thereof, a glass material, or a ceramics material.

14. A printed circuit board comprising an encapsulating package according to claim 5.

15. The electronic device comprising an encapsulating package according to claim 5.

16. The electronic device comprising a printed circuit board according to claim 14.

17. The encapsulating package according to claim 5, wherein the through hole is formed in a tapered shape, a diameter of which gradually becomes smaller with approach from a surface of the package main body section to an opposite side surface.

18. The encapsulating package according to claim 5, wherein the through hole is formed in a tapered shape, a diameter of which gradually becomes smaller with approach from a surface of the package main body section to a depth-wise center of the through hole.

19. The encapsulating package according to claim 5, wherein the through hole is formed so as to be diagonal with respect to a thickness direction of the package main body section.

20. The encapsulating package according to claim 5,
wherein the package main body section includes a cylindrical section formed in a cylinder shape, and a plate section formed in a plate shape, and
the plate section and the cylindrical section are bonded so that the plate section blocks a cylinder hole of the cylindrical section.

21. The encapsulating package according to claim 5, wherein the hollow section is filled with a nitrogen gas or an inert gas.

* * * * *